US011038050B2

(12) United States Patent
Omori

(10) Patent No.: US 11,038,050 B2
(45) Date of Patent: Jun. 15, 2021

(54) SEMICONDUCTOR DEVICE AND METHOD OF MANUFACTURING THE SAME

(71) Applicant: ROHM CO., LTD., Kyoto (JP)

(72) Inventor: Kengo Omori, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/990,423

(22) Filed: Aug. 11, 2020

(65) Prior Publication Data
US 2020/0373425 A1 Nov. 26, 2020

Related U.S. Application Data

(60) Continuation of application No. 16/785,074, filed on Feb. 7, 2020, now Pat. No. 10,770,583, which is a
(Continued)

(30) Foreign Application Priority Data

Aug. 24, 2011 (JP) .................. 2011-183041
Sep. 27, 2011 (JP) .................. 2011-211443
Jun. 11, 2012 (JP) .................. 2012-132261

(51) Int. Cl.
H01L 29/78 (2006.01)
H01L 21/8234 (2006.01)
(Continued)

(52) U.S. Cl.
CPC .... *H01L 29/7813* (2013.01); *H01L 21/26586* (2013.01); *H01L 21/823487* (2013.01);
(Continued)

(58) Field of Classification Search
CPC ......... H01L 29/78; H01L 29/06; H01L 29/66; H01L 29/7813; H01L 29/7827;
(Continued)

(56) References Cited

U.S. PATENT DOCUMENTS 6,501,129 B2  12/2002 Osawa
6,548,860 B1  4/2003 Hshieh et al.
(Continued)

FOREIGN PATENT DOCUMENTS

JP 2001339063 A  12/2001
JP 2002368220 A  12/2002
(Continued)

OTHER PUBLICATIONS

Notice of Reasons for Refusal of JP Patent Application No. JP 2019-086370 (related application); Sugiyama, Yoshihiro; Feb. 20, 2020; 16 pages.
(Continued)

Primary Examiner — Chuong A Luu
(74) Attorney, Agent, or Firm — Gregory M. Howison

(57) ABSTRACT

A wide band gap semiconductor device includes a semiconductor layer, a trench formed in the semiconductor layer, first, second, and third regions having particular conductivity types and defining sides of the trench, and a first electrode embedded inside an insulating film in the trench. The second region integrally includes a first portion arranged closer to a first surface of the semiconductor layer than to a bottom surface of the trench, and a second portion projecting from the first portion toward a second surface of the semiconductor layer to a depth below a bottom surface of the trench. The second portion of the second region defines a boundary surface with the third region, the boundary region being at an incline with respect to the first surface of the semiconductor layer.

48 Claims, 23 Drawing Sheets

Related U.S. Application Data continuation of application No. 16/210,247, filed on Dec. 5, 2018, now Pat. No. 10,593,794, which is a continuation of application No. 15/880,631, filed on Jan. 26, 2018, now Pat. No. 10,164,090, which is a continuation of application No. 15/336,985, filed on Oct. 28, 2016, now Pat. No. 9,917,185, which is a continuation of application No. 14/800,992, filed on Jul. 16, 2015, now Pat. No. 9,502,495, which is a continuation of application No. 14/147,614, filed on Jan. 6, 2014, now Pat. No. 9,117,683, which is a division of application No. 13/590,665, filed on Aug. 12, 2012, now Pat. No. 8,653,593.

(51) Int. Cl.

| | | |
|---|---|---|
| *H01L 21/265* | (2006.01) | |
| *H01L 29/417* | (2006.01) | |
| *H01L 29/423* | (2006.01) | |
| *H01L 29/66* | (2006.01) | |
| *H01L 29/10* | (2006.01) | |
| *H01L 29/06* | (2006.01) | |

(52) U.S. Cl.
CPC ...... *H01L 29/0615* (2013.01); *H01L 29/1095* (2013.01); *H01L 29/41766* (2013.01); *H01L 29/4236* (2013.01); *H01L 29/66727* (2013.01); *H01L 29/66734* (2013.01); *H01L 29/7827* (2013.01); *H01L 29/0696* (2013.01); *H01L 29/42376* (2013.01)

(58) Field of Classification Search
CPC ............. H01L 29/0615; H01L 29/1095; H01L 29/417; H01L 29/41766; H01L 29/4236; H01L 29/66727; H01L 29/66734; H01L 29/42376; H01L 29/423; H01L 29/0696; H01L 21/265; H01L 21/8234; H01L 21/823487; H01L 21/26586; H01L 29/8618; H01L 29/7781; H01L 29/7786; H01L 29/7787
USPC ....................................................... 257/334
See application file for complete search history.

(56) References Cited

U.S. PATENT DOCUMENTS

| | | |
|---|---|---|
| 6,624,469 B1 | 9/2003 | Harada |
| 6,784,505 B2 | 8/2004 | Zeng |
| 6,927,451 B1 | 8/2005 | Darwish |
| 7,504,306 B2 | 3/2009 | Sapp et al. |
| 7,557,395 B2 | 7/2009 | Ma et al. |
| 7,713,822 B2 | 5/2010 | Thorup et al. |
| 7,816,720 B1 | 10/2010 | Hsieh |
| 8,022,470 B2 | 9/2011 | Hider |
| 8,022,471 B2 | 9/2011 | Hshieh |
| 8,193,579 B2 | 6/2012 | Yoshimochi |
| 8,415,739 B2 | 4/2013 | Venkatraman et al. |
| 9,159,797 B2 | 10/2015 | Loechelt et al. |
| 9,818,845 B2 | 11/2017 | Sin et al. |
| 10,770,583 B2 * | 9/2020 | Omori ................. H01L 29/7813 |
| 2003/0213993 A1 | 11/2003 | Spring et al. |
| 2009/0200559 A1 | 8/2009 | Suzuki et al. |
| 2010/0006929 A1 | 1/2010 | Andou |
| 2010/0025759 A1 | 2/2010 | Yoshimochi |
| 2010/0044793 A1 | 2/2010 | Hoshino et al. |
| 2010/0078714 A1 | 4/2010 | Tu et al. |
| 2011/0059586 A1 | 3/2011 | Akiyama et al. |
| 2011/0121288 A1 | 5/2011 | Yamazaki et al. |

FOREIGN PATENT DOCUMENTS

| | | |
|---|---|---|
| JP | 2003529209 A | 9/2003 |
| JP | 2003318122 A | 11/2003 |
| JP | 2005526392 A | 9/2005 |
| JP | 2008218711 A | 9/2008 |
| JP | 2009117593 A | 5/2009 |
| JP | 2009141243 A | 6/2009 |
| JP | 2010021176 A | 1/2010 |
| JP | 2010062477 A | 3/2010 |
| JP | 2010098326 A | 4/2010 |
| JP | 2010147228 A | 7/2010 |
| JP | 2010258386 A | 11/2010 |
| JP | 2018093217 A | 6/2018 |

OTHER PUBLICATIONS

Notification of Reasons for Refusal of JP Patent Application No. JP 2018-021042 (related application); Tanada, Kazunari; Dec. 21, 2018; 9 pages.

* cited by examiner

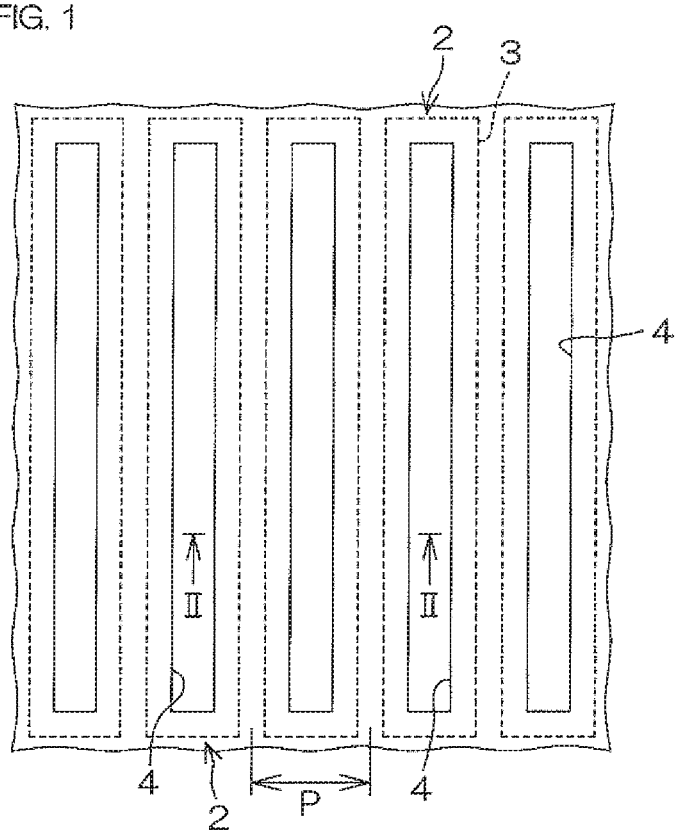

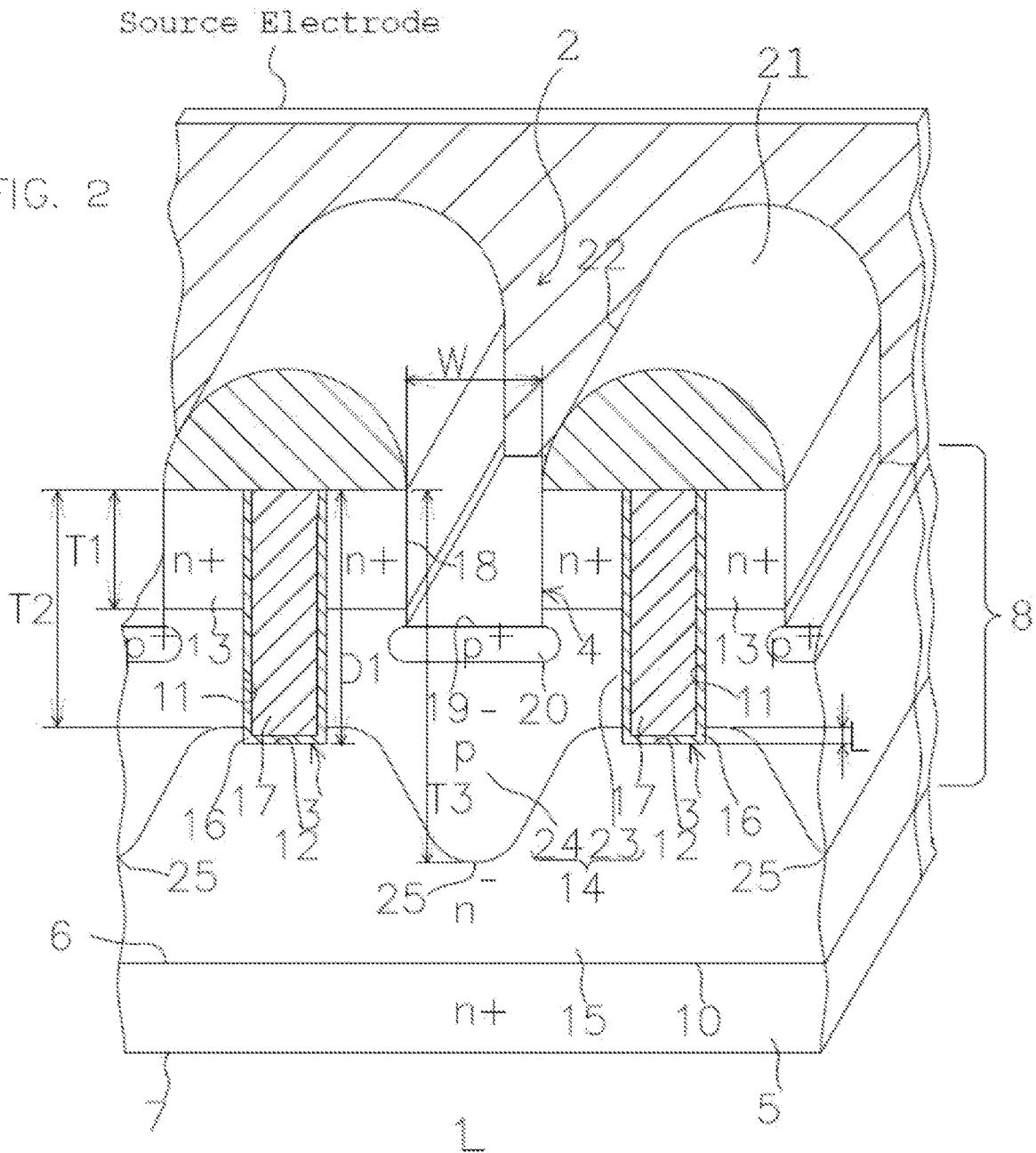

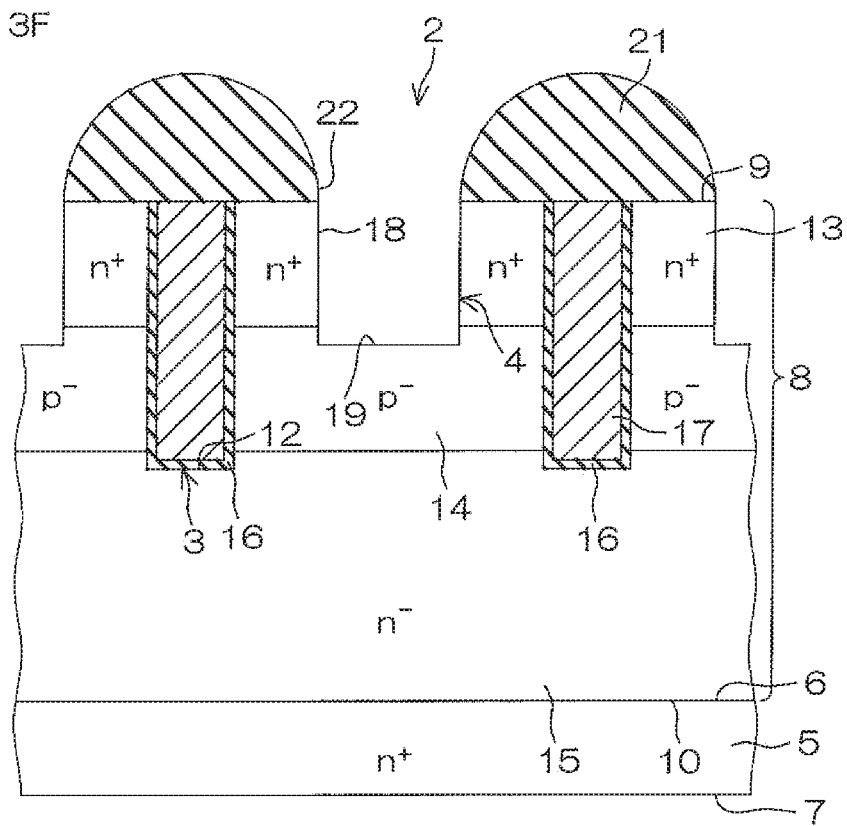

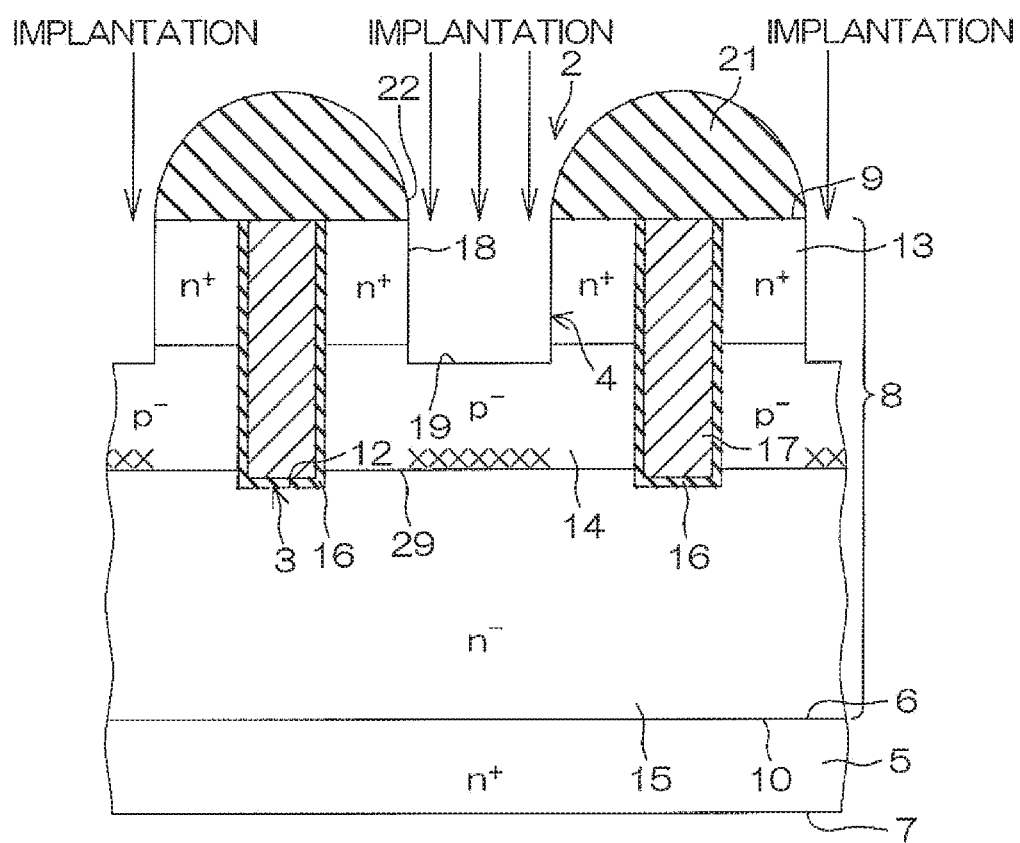

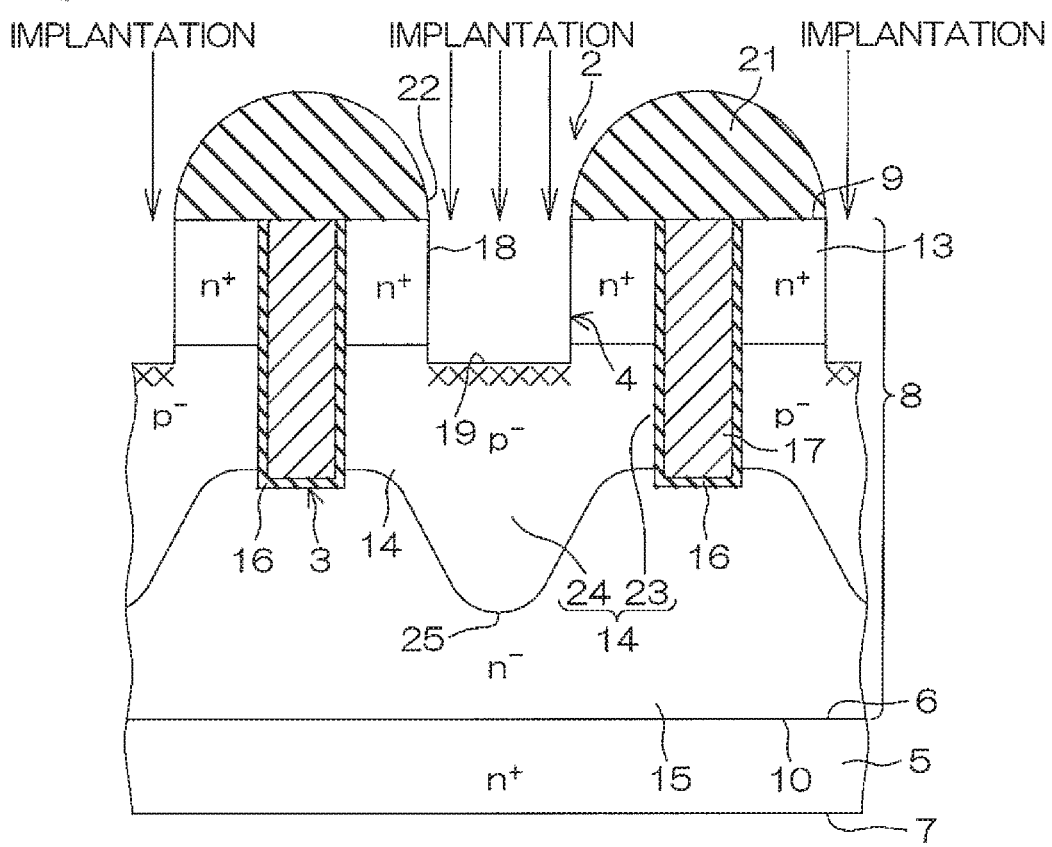

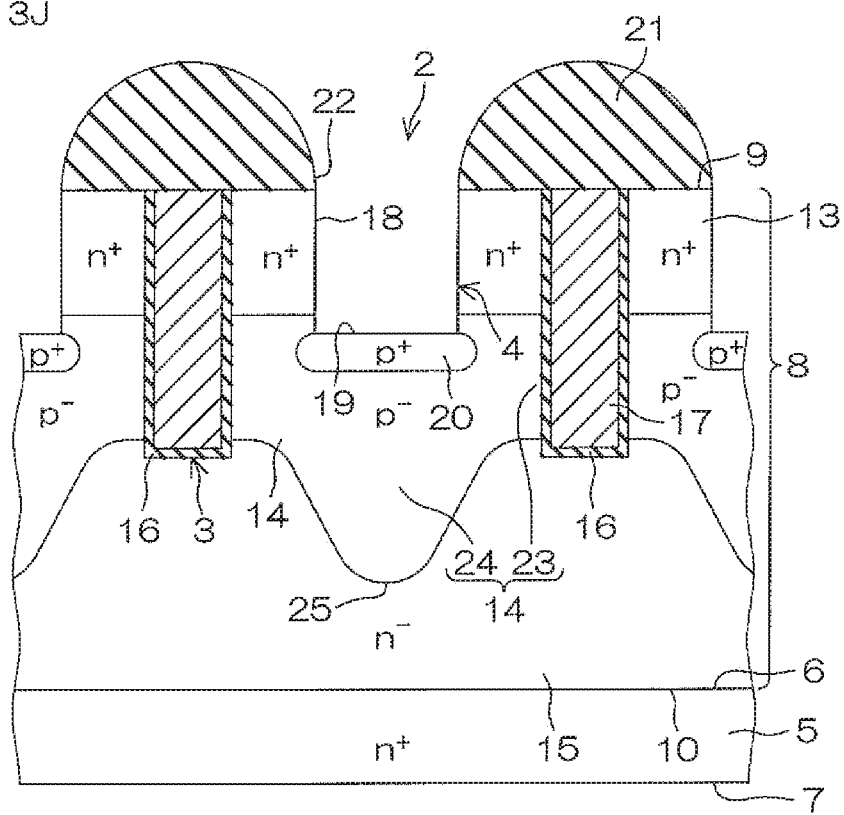

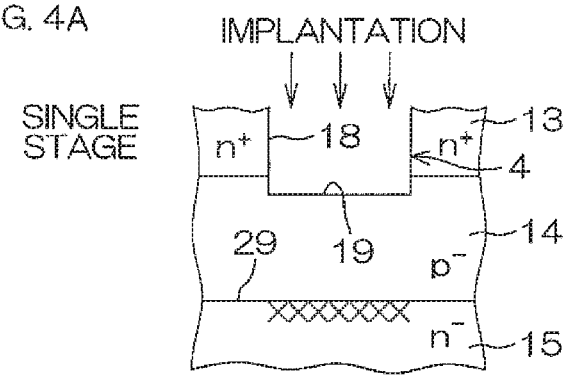
FIG. 4A SINGLE STAGE
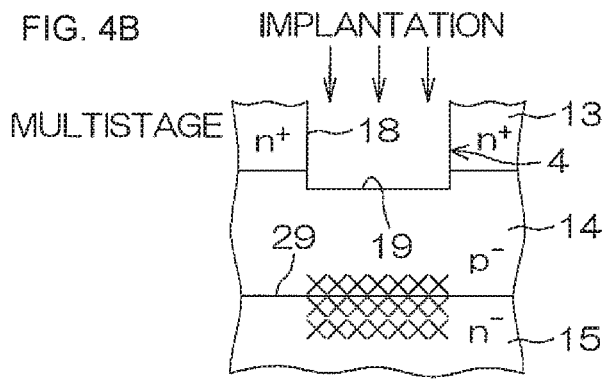
FIG. 4B MULTISTAGE
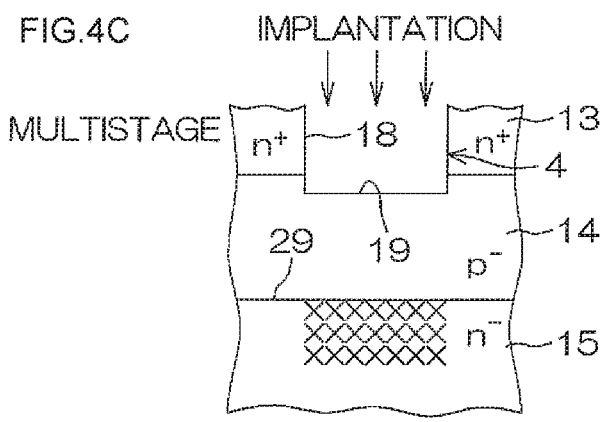
FIG. 4C MULTISTAGE
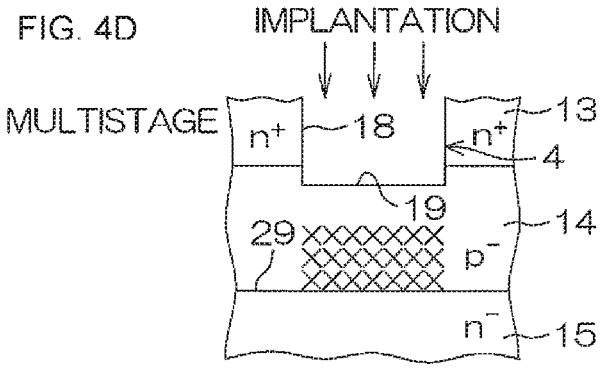
FIG. 4D MULTISTAGE

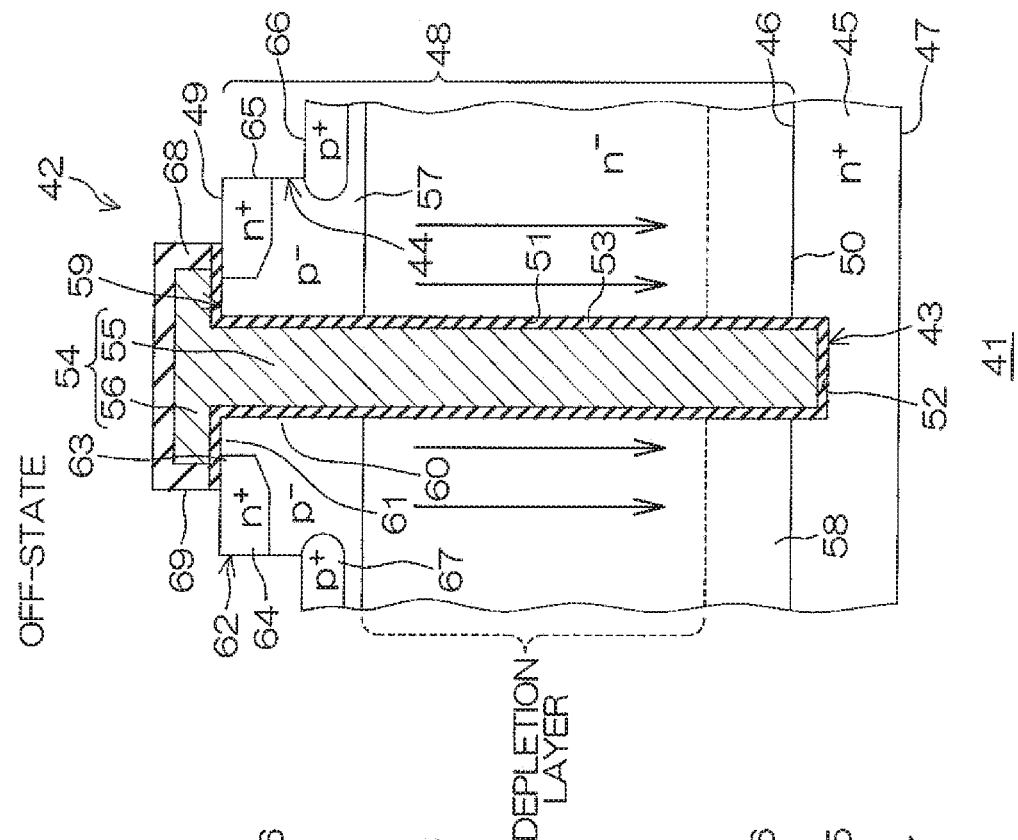
FIG. 13A ON-STATE
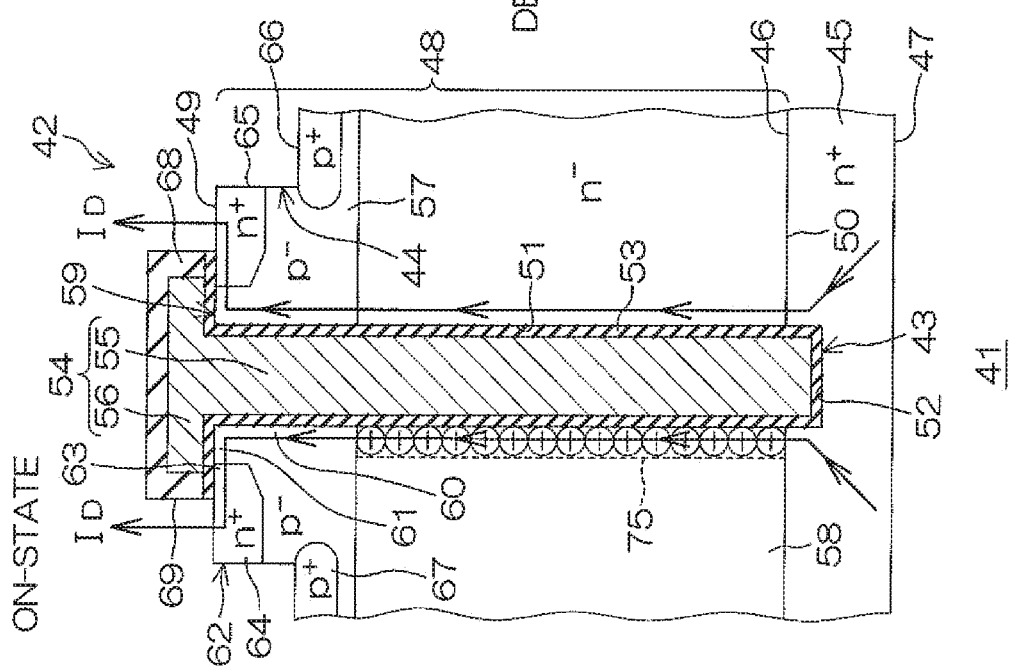
FIG. 13B OFF-STATE

US 11,038,050 B2

SEMICONDUCTOR DEVICE AND METHOD OF MANUFACTURING THE SAME

CROSS-REFERENCE TO RELATED APPLICATION

This is continuation of U.S. patent application Ser. No. 16/785,074, filed Feb. 7, 2020, entitled SEMICONDUCTOR DEVICE AND METHOD OF MANUFACTURING THE SAME, which is a continuation of U.S. patent application Ser. No. 16/210,247, filed on Dec. 5, 2018, entitled SEMICONDUCTOR DEVICE AND METHOD OF MANUFACTURING THE SAME, issued as U.S. Pat. No. 10,593,794 on Mar. 17, 2020. U.S. patent application Ser. No. 16/210,247 is a continuation of U.S. patent application Ser. No. 15/880,631, filed on Jan. 26, 2018, and issued as U.S. Pat. No. 10,164,090 on Dec. 25, 2018, which is a continuation of U.S. application Ser. No. 15/336,985, filed on Oct. 28, 2016, and issued on Mar. 13, 2018, as U.S. Pat. No. 9,917,185, which is a continuation of U.S. application Ser. No. 14/800,992, filed on Jul. 16, 2015, and issued on Nov. 22, 2016, as U.S. Pat. No. 9,502,495, which is, in turn, a continuation of U.S. application Ser. No. 14/147,614, filed on Jan. 6, 2014, and issued on Aug. 25, 2015, as U.S. Pat. No. 9,117,683, which was a division of U.S. application Ser. No. 13/590,665, filed on Aug. 21, 2012, and issued on Feb. 18, 2014, as U.S. Pat. No. 8,653,593. These prior U.S. applications and the present continuation application claim the benefit of priority of Japanese applications 2011-183041, filed on Aug. 24, 2011, 2011-211443, filed on Sep. 27, 2011, and 2012-132261, filed on Jun. 11, 2012. The disclosures of these prior U.S. and foreign applications are incorporated herein by reference.

BACKGROUND OF THE INVENTION

Field of the Invention

The present invention relates to a wide band gap semiconductor device including a trench gate MOSFET and a method of manufacturing the same.

Description of Related Art

As an example of a trench gate MOSFET, a wide band gap semiconductor device according to Patent Document 1 (Japanese Unexamined Patent Publication No. 2010-62477), for example, includes an $n^-$-type first base layer provided with a gate trench, a gate insulating film formed on the inner surface of the gate trench, a gate electrode charged into the gate insulating film, an interlayer dielectric film formed to cover the gate electrode, a p-type second base layer formed on the surface of the $n^-$-type first base layer to be shallower than the bottom surface of the gate trench, an $n^+$-type source layer formed on the surface of the p-type second base layer, a self-aligned contact trench formed into the p-type second base layer through the $n^+$-type source layer, a source electrode connected to the p-type second base layer on the bottom surface of the self-aligned contact trench and connected to the $n^+$-type source layer on the side surface of the self-aligned contact trench, an $n^+$-type drain layer formed on the back surface of the $n^-$-type first base layer, and a drain electrode formed on the $n^+$-type drain layer.

SUMMARY OF THE INVENTION

A wide band gap semiconductor device according to the present invention includes a wide band gap semiconductor device including a semiconductor layer having a first surface and a second surface, a trench formed on the first surface of the semiconductor layer, a first region of a first conductivity type formed at a first surface of the semiconductor layer, the first region forming part of a side surface of the trench, a second region of a second conductivity type formed on a side of the first region facing the second surface of the semiconductor layer, the second region forming part of the side surface of the trench, a third region of the first conductivity type formed on a side of the second region facing the second surface of the semiconductor layer, the third region forming a bottom surface of the trench, an insulating film formed on an inner surface of the trench, and a first electrode embedded inside the insulating film in the trench. The second region integrally includes a first portion arranged closer to the first surface of the semiconductor layer than to the bottom surface of the trench, and a second portion projecting from the first portion toward the second surface of the semiconductor layer to a depth below the bottom surface of the trench. The second portion of the second region defines a boundary surface with the third region, the boundary region being at an incline with respect to the first surface of the semiconductor layer.

According to the structure, part of the channel region projects toward the back surface of the semiconductor layer as the projection on a position different from the portion (the channel portion) where the channel is formed in operation. Thus, the area of a p-n junction interface can be increased without influencing channel characteristics of the semiconductor device as compared with a conventional structure having a constant depth from a surface of a semiconductor layer up to an interface (a p-n junction interface) between a channel region and a drain region. Therefore, the area of a depletion layer spreading from the p-n junction is also increased, whereby the depletion layer receives voltage with a large area. Consequently, the voltage received per unit area of the depletion layer can be reduced.

Also in a case where the quantity of projection of the gate trench toward the back surface of the semiconductor layer is small (the gate trench is shallow) with respect to the interface between the channel region and the drain region and withstand voltage cannot be ensured with only a depletion layer spreading from a small-area interface between the gate insulating film and the drain region, therefore, the large-area depletion layer is present in the vicinity of the projection of the channel region, whereby the withstand voltage of the overall semiconductor device can be improved.

Therefore, gate-to-drain capacitance can be reduced by shallowing the gate trench and reducing opposed areas of the gate electrode and the drain region while sufficiently holding source-to-drain withstand voltage.

Preferably, the semiconductor device further includes a contact trench passing through the source region from the surface of the semiconductor layer so that the deepest portion reaches the channel region and a second conductivity type channel contact region formed on a bottom surface of the contact trench, and the projection is formed immediately under the channel contact region.

The semiconductor device having such a structure can be manufactured by a method of manufacturing a wide band gap semiconductor device according to the present invention including the steps of forming, in a semiconductor layer having a first conductivity type source region formed to be exposed on a surface side, a second conductivity type channel region formed on a side of the source region closer to a back surface to be in contact with the source region, and a first conductivity type drain region formed on a side of the channel region closer to the back surface to be in contact with the channel region, a gate trench passing through the source region and the channel region so that the deepest portion reaches the drain region, forming a gate insulating film on an inner surface of the gate trench, forming a gate electrode by embedding an electrode material inside the gate insulating film, forming a contact trench passing through the source region so that the deepest portion reaches the channel region in the semiconductor layer, forming a projection projecting from an end portion, closer to a back surface of the semiconductor layer, of a channel portion of the channel region formed along a side surface of the gate trench toward the back surface immediately under the contact trench by implanting second conductivity type ions to reach the vicinity of an interface between the channel region and the drain region through a bottom surface of the contact trench, and forming a channel contact region on the channel region by implanting second conductivity type ions into the vicinity of the bottom surface of the contact trench of the semiconductor layer.

According to the method, the projection can be easily formed on the channel region by introducing the second conductivity type ions into the bottom surface of the contact trench lower by one stage than the surface of the semiconductor layer through conventional ion implantation. The second conductivity type ions may be diffused into the semiconductor layer by performing annealing after the implantation of the second conductivity type ions, in response to the type of the material for the semiconductor layer. Such diffusion can be similarly performed also when forming the channel contact region.

The projection as formed projects in a direction separating from the channel contact region toward the back surface of the semiconductor layer, whereby a depletion layer spreading from the interface between the projection and the drain region can be prevented from coming into contact with the channel contact region. Therefore, reduction of the withstand voltage resulting from contact between the depletion layer and the channel contact region can be avoided.

In this case, a top portion of the projection immediately under the channel contact region may be formed along a position under a central portion in the width direction of the bottom surface of the contact trench.

The semiconductor device having such a structure can be manufactured by carrying out a step of perpendicularly implanting the second conductivity type ions into the bottom surface of the contact trench in the method of manufacturing a wide band gap semiconductor device according to the present invention, for example.

According to the method, no precise angle adjustment is required in the implantation of the second conductivity type ions while the implantation angle may not be switched but the second conductivity type ions may simply be regularly perpendicularly implanted, whereby the projection can be more easily formed.

On the other hand, a top portion of the projection immediately under the channel contact region may be formed along a position under an end portion in the width direction of the bottom surface of the contact trench.

The semiconductor device having such a structure can be manufactured by carrying out a step of obliquely implanting the second conductivity type ions at an implantation angle inclining with respect to the bottom surface of the contact trench in the method of manufacturing a wide band gap semiconductor device according to the present invention, for example.

When the top portion of the projection is formed along the position under the end portion in the width direction of the bottom surface of the contact trench, the top portion preferably includes a plurality of top portions formed in parallel with one another along positions under both end portions in the width direction of the bottom surface in particular. In other words, the projection preferably so projects as to have not a single top portion (peak) but a plurality of top portions (peaks).

The semiconductor device having such a structure can be manufactured by carrying out a first step of implanting the second conductivity type ions into an end portion in the width direction of the bottom surface of the contact trench and a second step of implanting the second conductivity type ions into another end portion in the width direction of the bottom surface of the contact trench in a direction intersecting with the direction of introduction of the second conductivity type ions in the first step when obliquely implanting the second conductivity type ions.

According to the method, the implantation angle of the second conductivity type ions must be switched when shifting from the first step to the second step, while the area of the interface between the projection and the drain region can be further increased due to the plurality of top portions (peaks) of the projection. Consequently, the voltage received per unit area of the depletion layer can be further reduced.

Preferably in the semiconductor device according to the present invention, a top portion of the projection is positioned on a side of the bottom surface of the gate trench closer to the back surface of the semiconductor layer, and the impurity concentration in the projection is not more than 1/100 of the concentration in the channel contact region. When the impurity concentration in the projection satisfies the aforementioned condition, the withstand voltage can be further improved.

The semiconductor layer may consist of an Si semiconductor layer.

In the method of manufacturing a wide band gap semiconductor device according to the present invention, the step of forming the projection may include a single-stage implantation step of implanting the second conductivity type ions into a position of a prescribed depth from the bottom surface of the contact trench, or may include a multistage implantation step of implanting the second conductivity type ions into a prescribed depth from the bottom surface of the contact trench over a plurality of stages by varying implantation energy.

In the single-stage implantation step, the second conductivity type ions may be introduced into a depth position either on a side of the interface between the channel region and the drain region closer to the surface of the semiconductor layer or a side closer to the back surface.

In the multistage implantation step, the second conductivity type ions may be so implanted that a region defined by a plurality of stages of implanted portions extends over the sides of the interface between the channel region and the drain region closer to the surface and the back surface of the semiconductor layer so that some of implantation depths of the second conductivity type ions are on the surface side of the semiconductor layer and the rests are on the back surface side. Alternatively, the second conductivity type ions may be implanted so that the implantation depth of all second conductivity type ions is on the side of the interface between the channel region and the drain region closer to the surface or the back surface of the semiconductor layer.

Thus, a projection having any shape can be formed by selecting the single-stage or multistage ion implantation system and the implantation depth of the ions. Therefore, a projection having a proper shape can be formed in response to the shape and the depth of the gate trench and the shapes and the sizes of the impurity regions such as the source region and the channel region.

The foregoing and other objects, features and effects of the present invention will become more apparent from the following detailed description of the embodiments with reference to the attached drawings.

BRIEF DESCRIPTION OF THE DRAWINGS

FIG. 1 is a schematic plan view of a trench gate MOS transistor according to an embodiment of the present invention.

FIG. 2 is a bird's-eye sectional view of the trench gate MOS transistor taken along a cutting plane line II-II in FIG. 1.

FIGS. 3A to 3J partially illustrate manufacturing steps for the trench gate MOS transistor shown in FIG. 2 in step order.

FIGS. 4A to 4D show modifications of an ion implantation system shown in FIG. 3G, and FIG. 4A shows an example of single-state implantation while FIGS. 4B to 4D show examples of multistage implantation respectively.

FIGS. 13A and 13B show ON- and OFF-states of the MOS transistor shown in FIG. 11 respectively.

DETAILED DESCRIPTION OF THE EMBODIMENTS

Figure 3A:
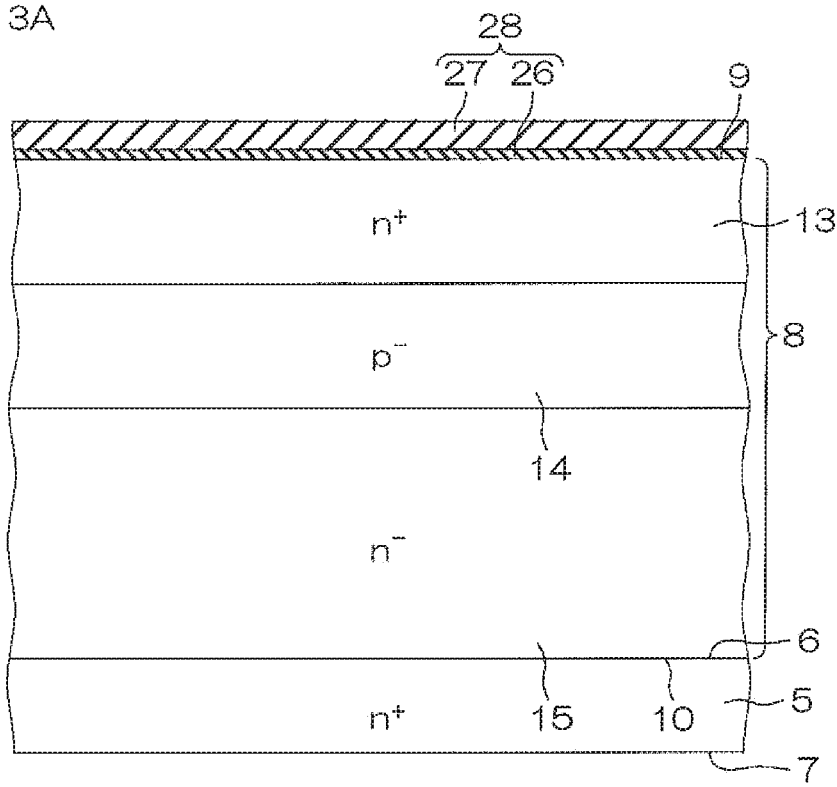

An embodiment of the present invention is now described in detail with reference to the attached drawings.

FIG. 1 is a schematic plan view of a trench gate MOS transistor according to the embodiment of the present invention. FIG. 2 is a bird's-eye sectional view of the trench gate MOS transistor taken along a cutting plane line II-II in FIG. 1.

Referring to FIG. 1, a MOS transistor 1 as a wide band gap semiconductor device is a trench gate MOSFET (Metal Oxide Semiconductor Field-Effect Transistor), and includes a plurality of striped unit cells 2 arrayed in parallel with one another. The MOS transistor 1 is partitioned into the unit cells 2 by striped gate trenches 3, and the interval between each adjacent pair of gate trenches 3 (the pitch P of the gate trenches 3) is 0.9 µm to 1.5 µm, for example. Each unit cell 2 is provided with an elongated contact trench 4 (rectangular in plan view) extending from a first longitudinal end toward a second longitudinal end thereof.

Referring to FIG. 2, the MOS transistor 1 includes an Si substrate 5 of an n+ type (having a concentration of $1 \times 10^{19}$ to $5 \times 10^{19}$ cm$^{-3}$, for example). The Si substrate 5 functions as a drain of the MOS transistor 1, and contains phosphorus (P), arsenic (As) or the like as an n-type impurity. This also applies to the following description.

An Si epitaxial layer 8 of an n− type (having a concentration of $1 \times 10^{16}$ to $1 \times 10^{15}$ cm$^{-3}$, for example) lower in concentration than the Si substrate 5 is stacked on a surface 6 (the upper surface) of the Si substrate 5. The thickness of the Si epitaxial layer 8 as a semiconductor layer is 3 µm to 10 µm, for example.

The gate trenches 3, having side surfaces 11 and bottom surfaces 12, dug down from a surface 9 of the Si epitaxial layer 8 toward the Si substrate 5 are formed in the Si epitaxial layer 8 in a striped manner. Thus, the plurality of striped unit cells 2 partitioned by the side surfaces 11 of the striped gate trenches 3 are formed in the Si epitaxial layer 8.

The depth $D_1$ of the gate trenches 3 measured from the surface 9 of the Si epitaxial layer 8 is 1.0 µm to 1.5 µm, for example, and more specifically, 1.0 µm.

In the Si epitaxial layer 8, source regions 13 of an n+ type and channel regions 14 of a p− type (having a concentration of $1 \times 10^{17}$ to $5 \times 10^{17}$ cm$^{-3}$, for example) are formed around the gate trenches 3 in this order from the side closer to the surface 9 of the Si epitaxial layer 8. The channel regions 14 contain boron (B), aluminum (Al) or the like, for example, as a p-type impurity. This also applies to the following description.

Each source region 13 is formed on a surface layer portion of each unit cell 2, to be exposed on the surface 9 of the Si epitaxial layer 8 and to form upper portions (part) of the side surfaces 11 of the corresponding gate trench 3. The thickness $T_1$ of the source region 13 along a direction from the surface 9 toward the Si substrate 5 is 0.2 µm to 0.4 µm, for example. In the following description, thicknesses are defined as those along the direction from the surface 9 toward the Si substrate 5, unless otherwise stated.

Each channel region 14 is formed on a side of the source region 13 closer to the Si substrate 5 (closer to a back surface 10 of the Si epitaxial layer 8) to be in contact with the source region 13 and to form lower portions (part) of the side surfaces 11 of the gate trench 3.

On the other hand, a region of the Si epitaxial layer 8 on a side of the channel region 14 closer to the Si substrate 5 is an n−-type drain region 15 maintaining a state after epitaxial growth as such. The drain region 15 is in contact with the channel region 14 on the side of the channel region 14 closer to the Si substrate 5, to form the bottom surface 12 of the gate trench 3.

A gate insulating film 16 is formed on the inner surfaces of the gate trench 3, to cover the whole area thereof. A gate electrode 17 is embedded in the gate trench 3 by charging polysilicon doped with an n-type impurity in a high concentration inside the gate insulating film 16. Thus, such a structure of the vertical MOS transistor 1 is constituted that the source region 13 and the drain region 15 are arranged to be separated from each other through the channel region 14 in the vertical direction perpendicular to the surface 9 of the Si epitaxial layer 8.

The contact trench 4 passing through the source region 13 from the surface 9 of the Si epitaxial layer 8 so that the deepest portion reaches the channel region 14 is formed in each unit cell 2. An opening width W of the contact trench 4 is constant in the depth direction thereof, and 0.2 µm to 0.5

µm, for example. The source region 13 is exposed on side surfaces 18 of the contact trench 4, while the channel region 14 is exposed on a bottom surface 19 of the contact trench 4.

A channel contact region 20 of a p$^+$ type (having a concentration of $1 \times 10^{19}$ to $1 \times 10^{20}$ cm$^{-3}$, for example) is formed in the channel region 14 exposed on the bottom surface 19 of the contact trench 4. The channel contact region 20 is linearly formed on the whole bottom surface 19 of the contact trench 4 along the longitudinal direction of the contact trench 4.

An interlayer dielectric film 21 is formed on the Si epitaxial layer 8. A contact hole 22 exposing the contact trench 4 is formed in the interlayer dielectric film 21.

A source electrode (not shown) is formed on the interlayer dielectric film 21, to be collectively in contact with all unit cells 2 (the source regions 13 and the channel contact regions 20) through the respective contact trenches 4. In other words, the source electrode serves as a wire common to all unit cells 2. A drain electrode is formed on a back surface 7 of the Si substrate 5, to cover the whole area thereof. The drain electrode serves as an electrode common to all unit cells 2.

According to this embodiment, a portion of the channel region 14 located immediately under the contact trench 4 projects (bulges) in the form of a crest in sectional view in a direction separating from the channel contact region 20.

More specifically, the channel region 14 projects in the form of a parabola drawn to have both ends in the vicinity of a channel portion 23 of the channel region 14 where a channel is formed in operation of the MOS transistor 1 so that one peak (a top portion 25) reaches a position under a central portion in the width direction of the bottom surface 19 of the contact trench 4 from these ends. Thus, the channel region 14 has a projection 24 projecting from an end portion of the channel portion 23 closer to the back surface 10 of the Si epitaxial layer 8 toward the back surface 10 as a portion partitioned by the parabola.

The top portion 25 (the peak of the parabola) of the projection 24 is positioned on a side of the bottom surface 12 of the gate trench 12 closer to the back surface 10 of the Si epitaxial layer 8 (i.e. deeper than the bottom surface 12 of the gate trench 3) in a range not coming into contact with the Si substrate 5, and linearly formed along the contact trench 4. Preferably, the conductivity type of the projection 24 is the same p$^-$ type (having a concentration of $1 \times 10^{17}$ to $5 \times 10^{17}$ cm$^{-3}$, for example) as the channel region 14, and the impurity concentration therein is not more than 1/100 of that in the channel contact region 20 of the p$^+$ type (having the concentration of $1 \times 10^{19}$ to $1 \times 10^{20}$ cm$^{-3}$, for example).

In the channel region 14, the thickness $T_2$ of the channel portion 23 is 0.5 µm to 0.9 µm, for example, and more specifically, 0.8 µm. The thickness $T_3$ up to the top portion 25 of the projection 24 is 1.0 µm to 1.6 µm, for example, and more specifically, 1.4 µm.

FIGS. 3A to 3J partially illustrate manufacturing steps for the trench gate MOS transistor 1 shown in FIG. 2 along cutting plane lines on the same position as that in FIG. 2.

In order to manufacture the MOS transistor 1, an Si crystal is grown on the surface 6 of the Si substrate 5 while doping an n-type impurity by epitaxy such as CVD (Chemical Vapor Deposition), LPE (Liquid Phase Epitaxy) or MBE (Molecular Beam Epitaxy), as shown in FIG. 3A. Thus, the n$^-$-type Si epitaxial layer 8 (the drain region 15) is formed on the Si substrate 5. Then, a p-type impurity and an n-type impurity are successively implanted into the surface 9 of the Si epitaxial layer 8. After the implantation, the implanted p- and n-type impurities are activated by annealing (at 900° C. to 1000° C. for 10 minutes to 30 minutes, for example), thereby simultaneously forming the channel region 14 and the source region 13. Then, an SiO$_2$ film 26 is formed on the surface 9 of the Si epitaxial layer 8 by CVD, for example, and an SiN film 27 is formed on the SiO$_2$ film 26, thereby forming a two-layer hard mask 28 consisting of the SiO$_2$ film 26 and the SiN film 27. The thickness of the SiO$_2$ film 26 is set to 50 Å to 100 Å, for example, and the thickness of the SiN film 27 is set to 1000 Å to 1500 Å, for example.

Figure 3B:
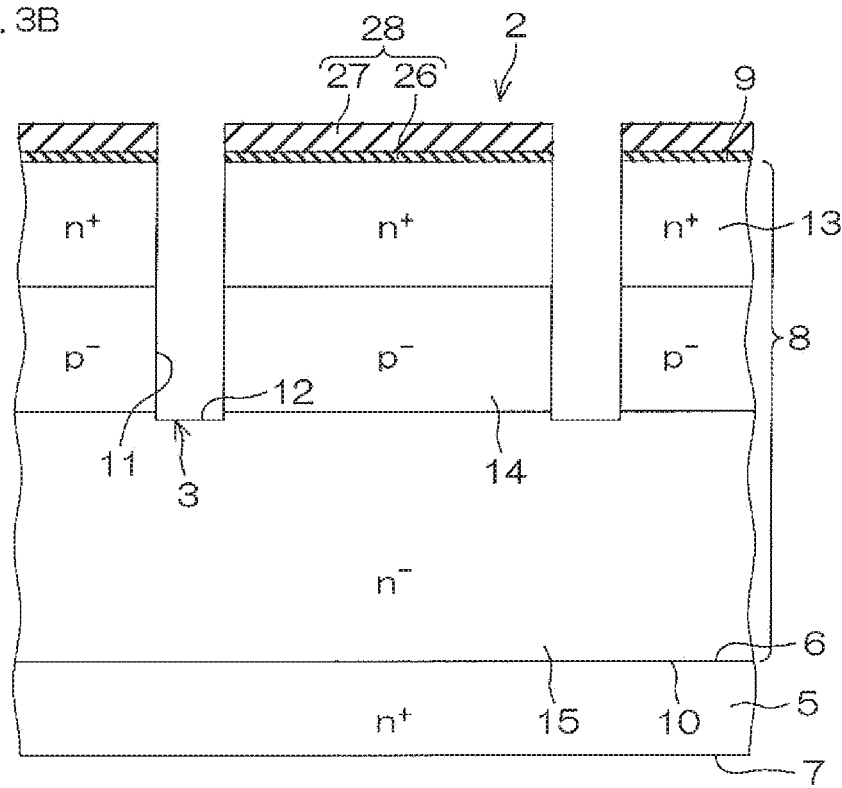

Then, the Si epitaxial layer 8 is etched through the hard mask 28, as shown in FIG. 3B. Thus, the Si epitaxial layer 8 is dry-etched from the surface 9, to form the gate trenches 3. At the same time, the plurality of unit cells 2 are formed in the Si epitaxial layer 8.

Figure 3C:
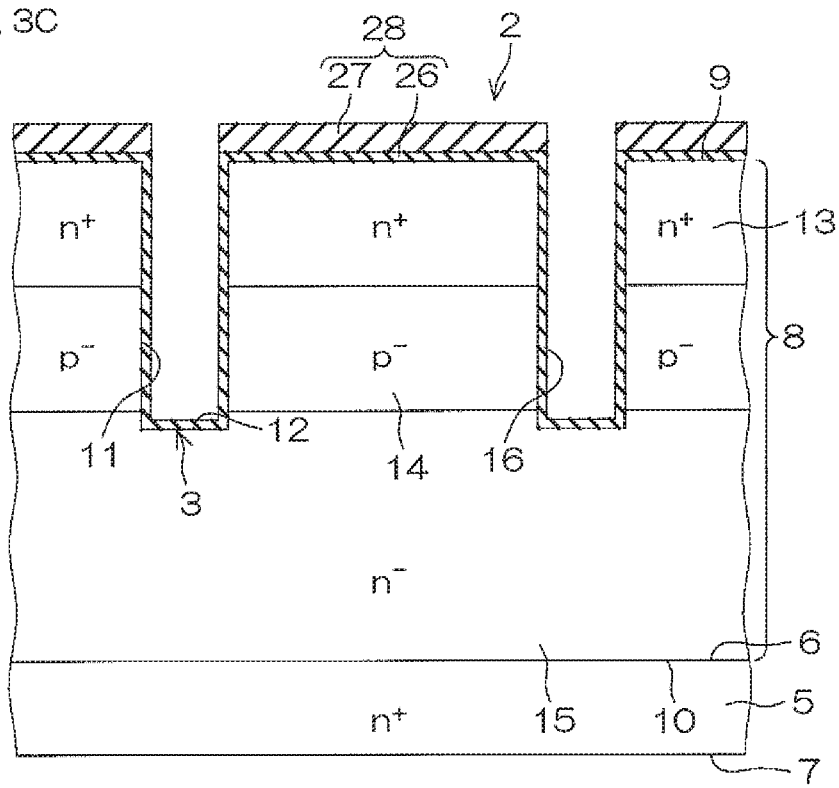

Then, the gate insulating films 16 are formed on the inner surfaces (the side surfaces 11 and the bottom surfaces 12) of the gate trenches 3 by thermal oxidation (at 850° C. to 950° C. for 10 minutes to 30 minutes, for example), for example, as shown in FIG. 3C.

Figure 3D:
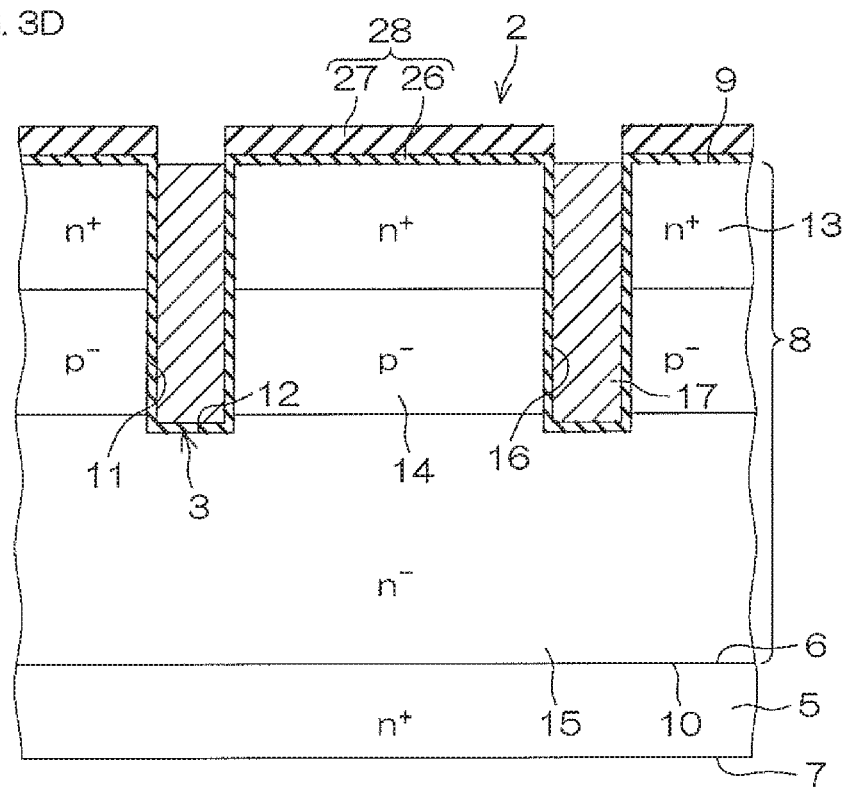

Then, doped polysilicon (an electrode material) is deposited from above the Si epitaxial layer 8 by CVD, for example, as shown in FIG. 3D. The deposition of the polysilicon is continued until at least the surface 9 of the Si epitaxial layer 8 is concealed. Thereafter the deposited polysilicon is etched back until the etched-back surface is flush with the surface 9 of the Si epitaxial layer 8. Thus, the gate electrodes 17 consisting of the polysilicon remaining in the gate trenches 3 are formed.

Figure 3E:
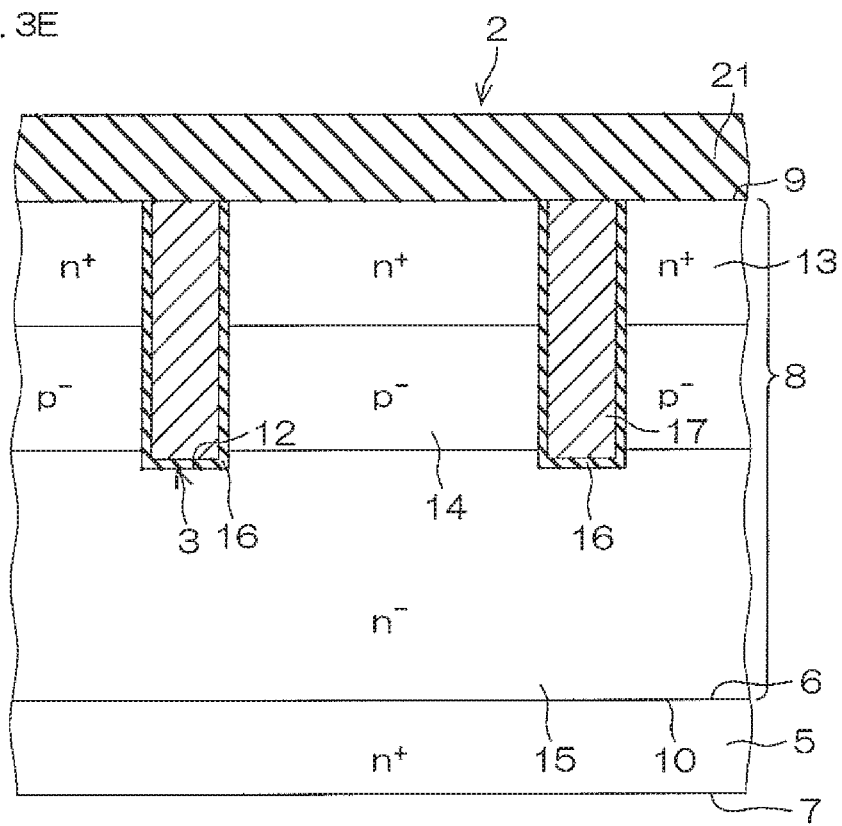

Then, the interlayer dielectric film 21 is formed by depositing SiO$_2$ (an insulating material) from above the Si epitaxial layer 8 by CVD, for example, as shown in FIG. 3E.

Then, each contact hole 22 is formed in the interlayer dielectric film 21 by dry etching, for example, as shown in FIG. 3F. After the formation of the contact hole 22, the exposed Si epitaxial layer 8 is etched through the interlayer dielectric film 21 employed as a mask. Thus, the Si epitaxial layer 8 is dry-etched from the surface 9, and each contact trench 4 is formed in a self-aligned manner with respect to the interlayer dielectric film 21.

Then, impurity ions (B$_{11}$ ions) are introduced in a direction perpendicular to the bottom surface 12 of the contact trench 4 thereby implanting the impurity ions by one stage into a depth position on a side of an interface 29 between the channel region 14 and the drain region 15 closer to the surface 9 of the epitaxial layer 8 (a portion of the channel region 14 in the vicinity of the interface 29), as shown in FIG. 3G. The implantation energy for the impurity ions is 100 keV to 140 keV, for example, and preferably about 140 keV. The dosage of the impurity ions is $4 \times 10^{12}$ cm$^{-2}$ to $1 \times 10^{13}$ cm$^{-2}$, for example, and preferably $6 \times 10^{12}$ cm$^{-2}$ to $8 \times 10^{12}$ cm$^{-2}$.

Figure 3H:
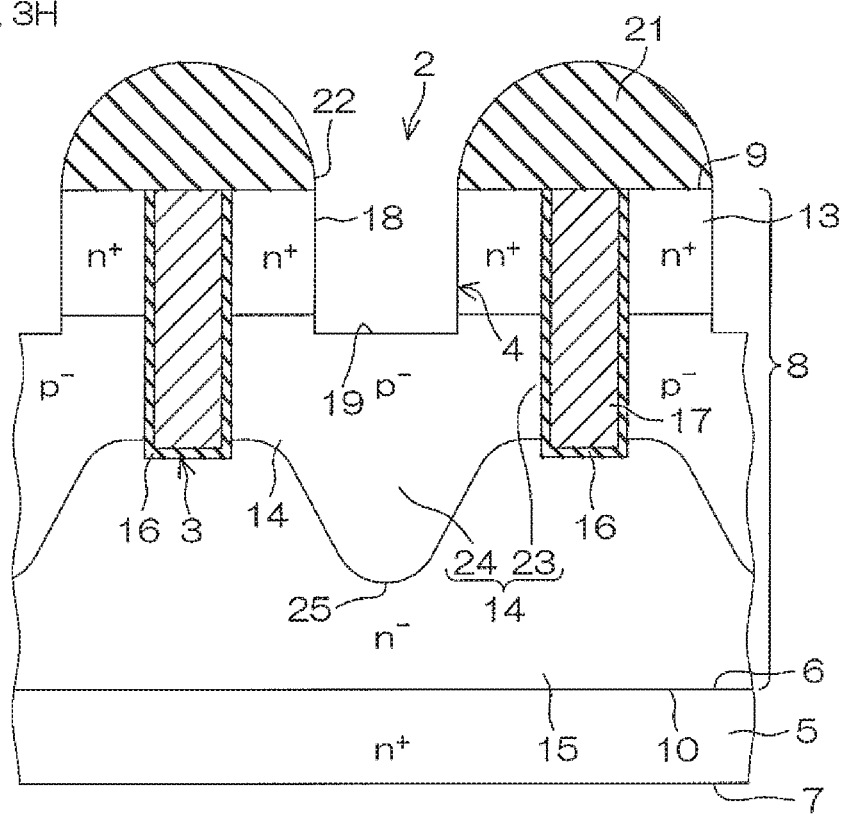

After the implantation, the implanted p-type impurity ions are diffused and activated by annealing (at 900° C. to 950° C. for 0.5 minutes to 1 minute, for example) thereby forming the projection 24 of the channel region 14, as shown in FIG. 3H.

Then, impurity ions (BF$_2$ ions) are introduced in the direction perpendicular to the bottom surface 12 of the contact trench 4 at implantation energy of about 40 keV with a dosage of about $1 \times 10^{15}$ cm$^{-2}$ thereby implanting the impurity ions by one stage into a depth position of the channel region 14 in the vicinity of the bottom surface 12, as shown in FIG. 3I.

A source electrode is formed on the interlayer dielectric film 21, to be collectively in contact with all unit cells 2 (the source regions 13 and the channel contact regions 20)

through the respective contact trenches 4. In other words, the source electrode serves as a wire common to all unit cells 2. A drain electrode is formed on a back surface 7 of the Si substrate 5, to cover the whole area thereof. The drain electrode serves as an electrode common to all unit cells 2.

Thereafter the MOS transistor 1 shown in FIG. 2 is obtained by forming the source electrode (not shown), the drain electrode (not shown) and the like.

According to this embodiment, as hereinabove described, the channel region 14 partially projects as the projection 24 in the form of the parabola drawn to have both ends in the vicinity of the channel portion 23 of the channel region 14 so that one peak reaches the position under the central portion in the width direction of the bottom surface 19 of the contact trench 4 from these ends. Thus, the area of a p-n junction interface can be increased without influencing channel characteristics of the MOS transistor 1 as compared with such a conventional structure that the depth from the surface 9 of the Si epitaxial layer 8 to the interface (the p-n junction interface) between the channel region 14 and the drain region 15 is constant. In other words, only the portion of the channel region 14 located immediately under the contact trench 4 is projected without changing the length (the channel length) of the channel portion 23, whereby the channel characteristics are hardly influenced. Therefore, the area of a depletion layer spreading from the p-n junction is also increased, whereby the depletion layer receives voltage with a large area. Consequently, the voltage received per unit area of the depletion layer can be reduced.

Also in a case where the quantity L (in this embodiment, 0.2 μm to 0.1 μm, for example) of projection of the gate trench 3 toward the side of the interface between the channel portion 23 and the drain region 15 closer to the back surface 10 of the Si epitaxial layer 8 is small (the gate trench 3 is shallow) and withstand voltage cannot be ensured only with a depletion layer spreading from a small-area interface between the gate insulating film 16 and the drain region 15, therefore, the large-area depletion layer is present in the vicinity of the projection 24 of the channel region 14, whereby the withstand voltage of the overall MOS transistor 1 can be improved.

Therefore, gate-to-drain capacitance can be reduced by shallowing the gate trench 3 thereby reducing opposed areas of the gate electrode 17 and the drain region 15 while sufficiently holding source-to-drain withstand voltage.

Further, the projection 24 of the channel region 14 projects in the direction separating from the channel contact region 20, whereby the depletion layer spreading from the interface between the projection 24 and the drain region 15 can be prevented from coming into contact with the channel contact region 20. Therefore, reduction of the withstand voltage resulting from contact between the depletion layer and the channel contact region 20 can be avoided.

The projection 24 can be easily formed by introducing the impurity ions into the bottom surface 12 of the contact trench 4 lower by one stage than the surface 9 of the Si epitaxial layer 8 through the conventional ion implantation. Further, the projection 24 can be formed by introducing the impurity ions perpendicularly into the bottom surface 12 of the contact trench 4, whereby no precise angle adjustment is required in the implantation of the impurity ions while the implantation angle may not be switched.

The ion implantation system and the ion implantation depth for forming the projection 24 can be varied with the shape and the depth of the gate trench 3 and the shapes and the sizes of the impurity regions such as the source region 13 and the channel region 14.

For example, the impurity can be implanted by one stage into a depth position on the side of the interface 29 between the channel region 14 and the drain region 15 closer to the back surface 10 of the Si epitaxial layer 8 (a portion of the drain region 15 in the vicinity of the interface 29), as shown in FIG. 4(*a*).

Further, impurity ions can also be multistage-implanted over a plurality of stages by varying implantation energy in the range of 80 keV to 180 keV so that regions defined by implanted portions extend over the sides of the interface 29 closer to the surface 9 and the back surface 10 of the Si epitaxial layer 8 so that some of implantation depths of the impurity ions ($B_{11}$ ions) are on the side closer to the surface 9 of the epitaxial layer 8 and the rests are on the side closer to the back surface 10, as shown in FIG. 4(*b*).

In a case of employing the multistage implantation, impurity ions may be implanted so that implantation depths of all impurity ions are on the side of the interface 29 closer to the back surface 10 of the Si epitaxial layer 8 as shown in FIG. 4(*c*), or impurity ions may be implanted so that implantation depths of all impurity ions are on the side of the interface 29 closer to the surface 9 of the Si epitaxial layer 8 as shown in FIG. 4(*d*).

Thus, a projection 24 of any shape can be formed by selecting the ion implantation system such as the single- or multistage system and the ion implantation depths. Therefore, the projection 24 of a proper shape can be formed in response to the shape and the depth of the gate trench 3 and the shapes and the sizes of the impurity regions such as the source region 13 and the channel region 14.

Figure 5:
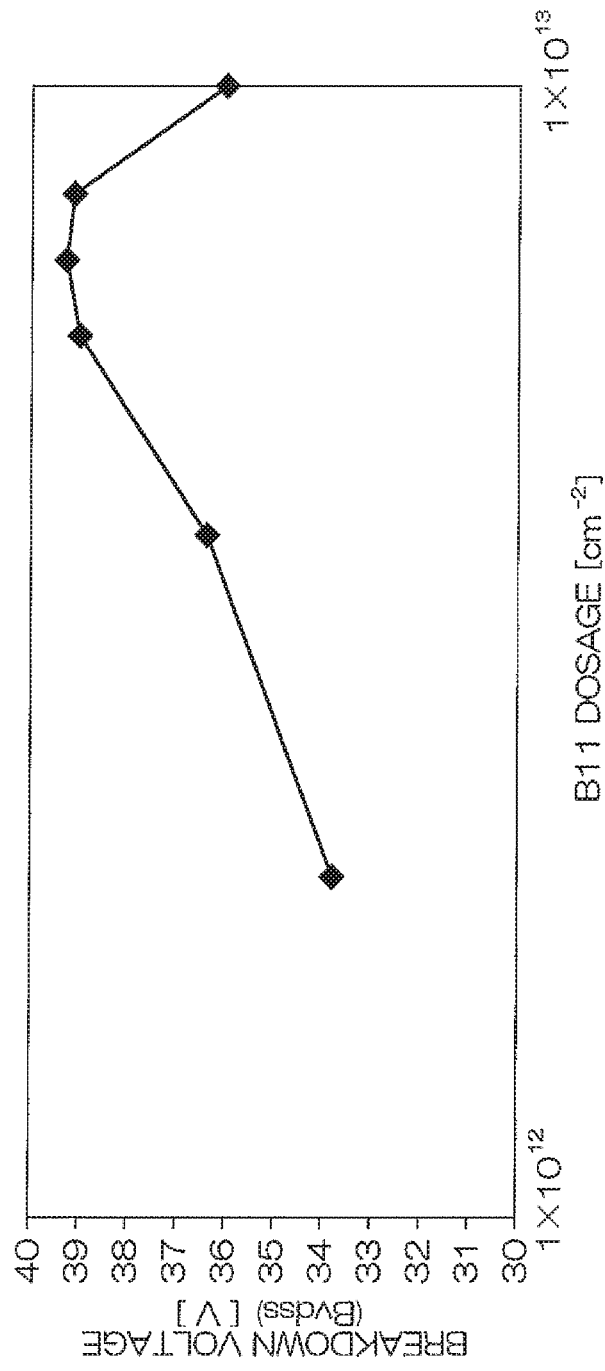
FIG. 5 is a graph showing the relation between dosages of $B_{11}$ ions and breakdown voltage.

Drain-to-source breakdown voltage can be improved by setting the dosage of the impurity ($B_{11}$ ions) in the range of $4\times10^{12}$ cm$^{-2}$ to $1\times10^{13}$ cm$^{-2}$. More specifically, it was possible to set breakdown voltage to not less than 36 V when the dosage of $B_{11}$ ions was in the range of $4\times10^{12}$ cm$^{-2}$ to $1\times10^{13}$ cm$^{-2}$, as shown in FIG. 5 (implantation energy=140 keV).

The projection 24 may not necessarily be partitioned by one parabola in sectional view, but may alternatively be partitioned by two parabolas, for example.

Figure 6:
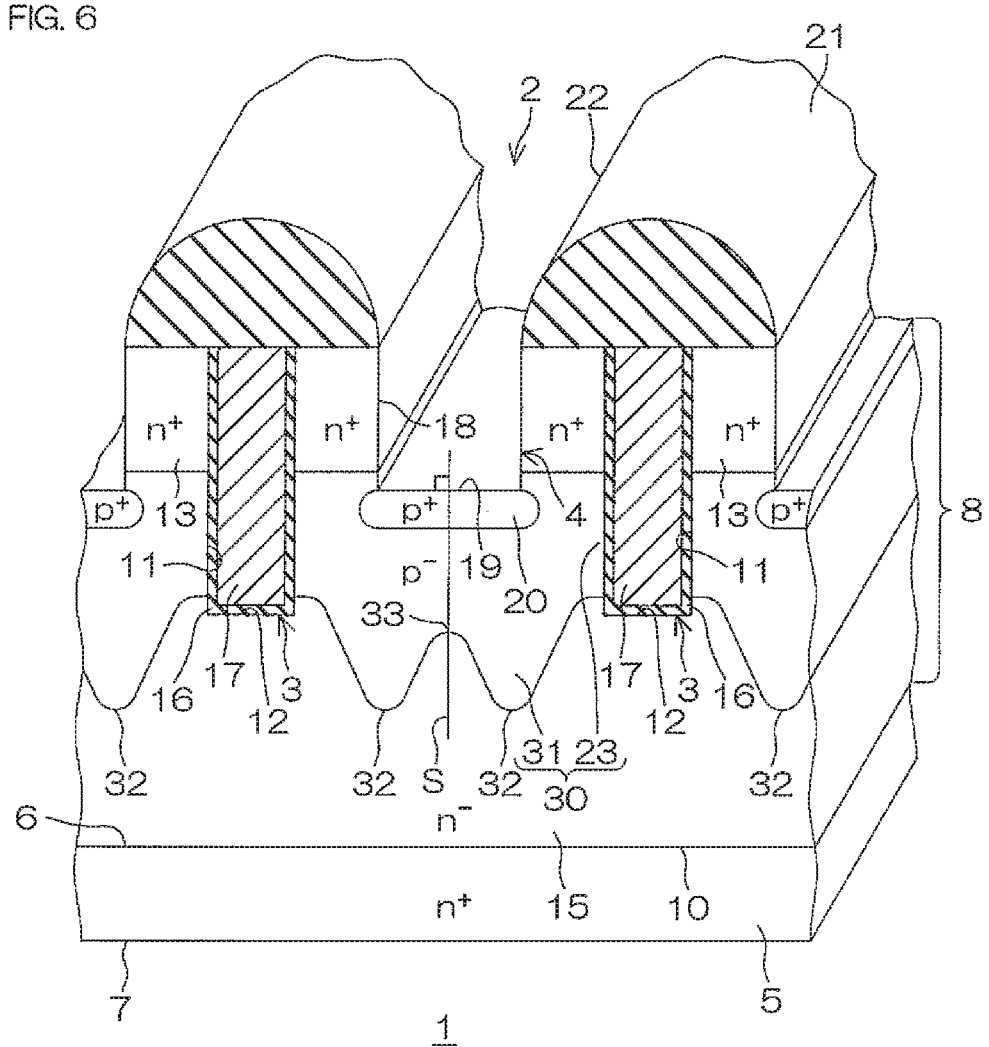
FIG. 6 illustrates a modification of a projection of the trench gate MOS transistor shown in FIG. 1.
Figure 7:
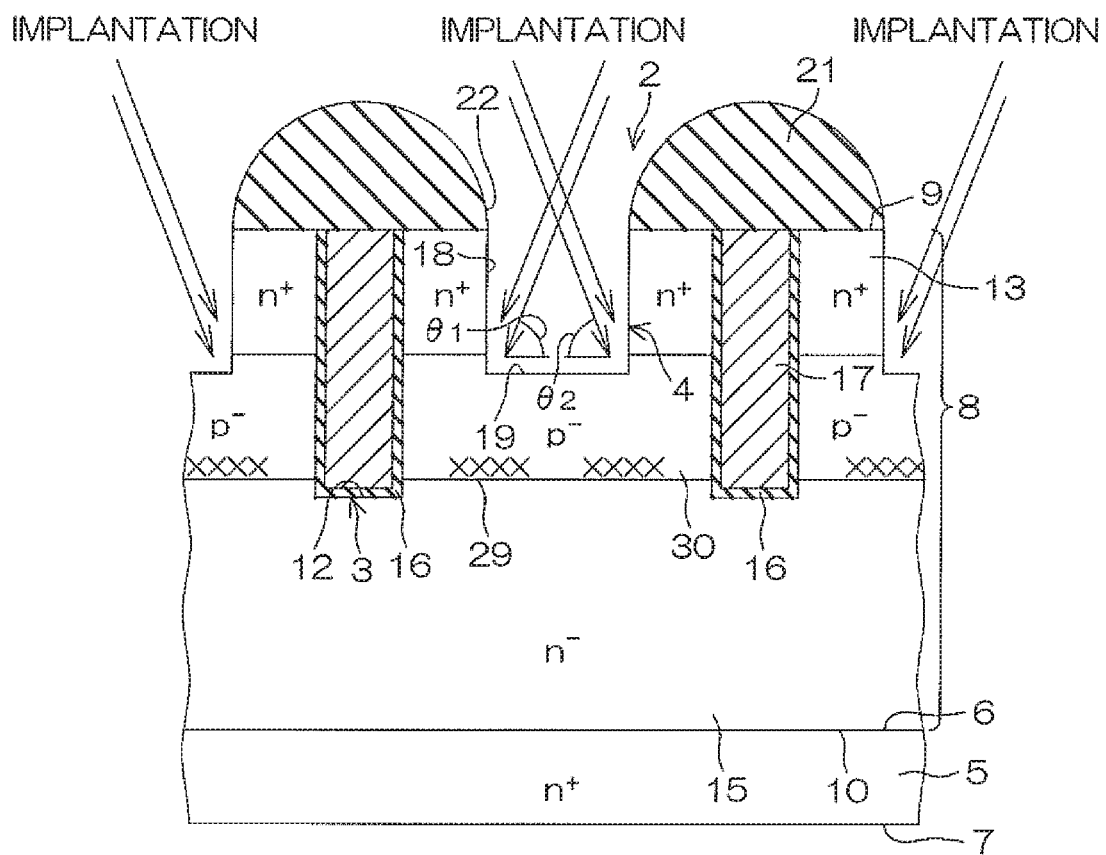
FIG. 7 is a diagram for illustrating ion implantation for forming the projection shown in FIG. 6.

More specifically, a projection 31 of a channel region 30 preferably projects in the form of two parabolas drawn to have both ends in the vicinity of a channel portion 23 so that peaks (top portions 32) reach positions under first and second end portions in the width direction of a bottom surface 19 of a contact trench 4 respectively from these ends, as shown in FIG. 6. In this case, the respective top portions 32 of the projection 31 parallelly align with each other along the contact trench 4. The top portions 32 are preferably line-symmetrical with respect to a symmetry axis s formed by a perpendicular passing through a central portion in the width direction of the bottom surface 19 of the contact trench 4, and an opposite top portion 33 located on the symmetry axis s is preferably positioned on a side of the bottom surface 12 of the gate trench 3 closer to a back surface 10 of an Si epitaxial layer 8 (i.e., on a position deeper than the bottom surface 12 of the gate trench 3).

The projection 31 shown in FIG. 6 can be formed by carrying out a first step of implanting impurity ions into the first end portion in the width direction of the contact trench 4 at an implantation angle $\theta_1$ inclining by 7° to 14° with respect to the bottom surface 12 of the contact trench 4 and a second step of implanting impurity ions into the second end portion in the width direction of the contact trench 4 at an implantation angle $\theta_2$ inclining by 7° to 14° with respect to the bottom surface 12 of the contact trench 4 to intersect with the direction of introduction of the impurity ions in the first step, in place of the step shown in FIG. 3G, for example.

While the implantation angle for the impurity ions must be switched ($\theta_1 \rightarrow \theta_2$) according to the method when shifting from the first step to the second step, the projection 31 has the plurality of top portions 32 (peaks) and hence the area of an interface between the projection 31 and a drain region 15 can be further increased. Consequently, voltage received per unit area of a depletion layer can be further reduced.

While the embodiment of the present invention has been described, the present invention may be embodied in other ways.

Figure 8:
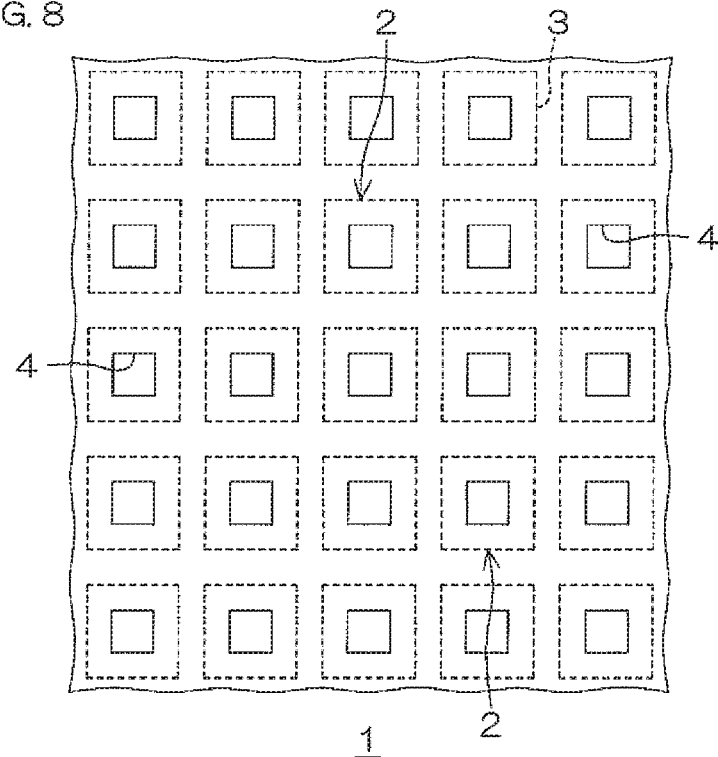
FIG. 8 illustrates a first modification of a layout of unit cells of the trench gate MOS transistor shown in FIG. 1.
Figure 9:
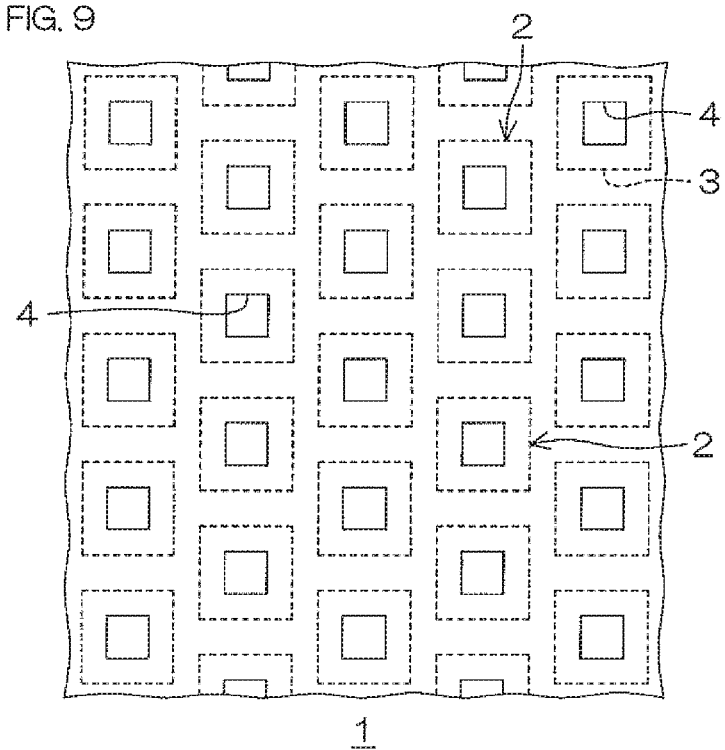
FIG. 9 illustrates a second modification of the layout of the unit cells of the trench gate MOS transistor shown in FIG. 1.

For example, the unit cells 2 may not necessarily be arranged in a striped manner, but may be arranged in the form of a matrix as shown in FIG. 8, or may be arranged in a zigzag manner as shown in FIG. 9.

Further, each unit cell 2 is not restricted to the striped shape (FIG. 1) or a square pole shape (FIG. 8 or 9), but may be in the form of another polygon such as a triangular, pentagonal or hexagonal prism, for example.

In the MOS transistor 1, the conductivity types of the semiconductor portions may be reversed. For example, the p-type and n-type portions of the MOS transistor 1 may alternatively be formed as n-type and p-type portions respectively.

The Si epitaxial layer 8 may be replaced with an SiC epitaxial layer, for example.

The projection of the channel region may not necessarily be located immediately under the contact trench 4 as the projection 24 or 31, but may be formed on any other position in the range not influencing the channel characteristics of the MOS transistor 1.

Further, various modifications may be made to the design in the range of the scope of Claims for patent.

Invention Related to Reference Example

Background Technique of Reference Example

For example, a wide band gap semiconductor device according to Patent Document 2 (Japanese Unexamined Patent Publication No. 2010-021176) is known as an example of a MOSFET.

The semiconductor device can be formed as a p-channel power MOSFET (Metal-Oxide-Semiconductor Field-Effect transistor) including a trench gate. The semiconductor device includes a semiconductor substrate constituted of a $p^+$-type silicon substrate, a p-type semiconductor layer formed thereon and an n-type channel layer formed thereon.

The semiconductor device further includes an $n^+$-type body region formed on a surface of the semiconductor substrate on the channel layer and a $p^+$-type source region surrounding all sides of the body region in plan view. Further, the semiconductor device includes a gate trench passing through the channel layer to reach the p-type semiconductor layer, a gate insulating film formed on a side surface of the gate trench, a thick oxide film, having a larger thickness than the gate oxide film, formed on a bottom surface of the gate trench, and a gate electrode formed in the gate trench on the gate oxide film and the thick oxide film to fill up the gate trench.

The semiconductor device further includes a source electrode formed on the semiconductor substrate, an interlayer dielectric film formed on the gate electrode to insulate the gate electrode and the source electrode from each other, and a drain electrode provided on a back surface of the semiconductor substrate opposite to the surface provided with the source electrode in contact with the silicon substrate.

Problem to be Solved by Reference Example

According to Patent Document 2, the source region is formed by selectively implanting impurity ions into the semiconductor substrate and heat-treating the same after forming the gate electrode by removing polysilicon exposed from the gate trench by etchback.

In this method, however, there is an apprehension that the source region formed by ion implantation has a depth exceeding a designed value and the channel layer located immediately under the same is partially altered to the source region. Due to the alteration, the thickness of the channel layer is disadvantageously reduced below a designed value, to reduce the channel length.

The upper surface (the etched-back surface) of the gate electrode is frequently indented with respect to the surface of the semiconductor surface, due to low working accuracy of the etchback. Therefore, the impurity ions implanted into the surface of the semiconductor substrate are partially implanted into the semiconductor substrate also from the side surface of the gate trench exposed around the etched-back surface of the gate electrode.

An object of Reference Example is to provide a semiconductor device allowing precise control of a channel length and a method of manufacturing the same.

Another object of Reference Example is to provide a semiconductor device capable of compatibly attaining high withstand voltage and low on-resistance and a method of manufacturing the same.

Embodiment of Reference Example

An embodiment of Reference Example is now described in detail with reference to the attached drawings.

Figure 10:
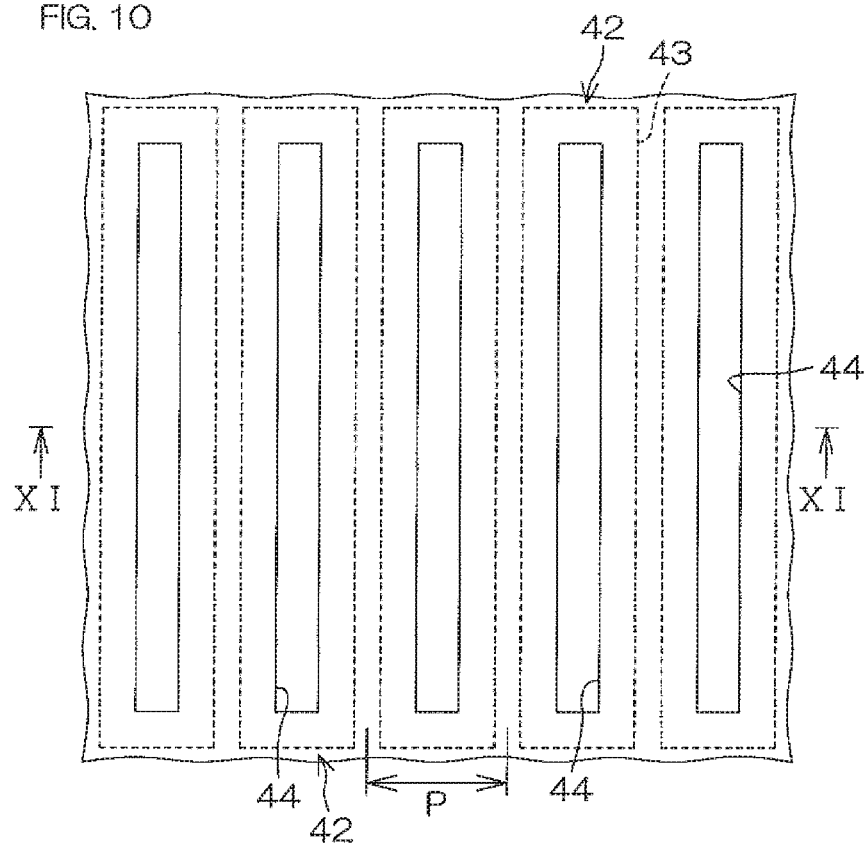
FIG. 10 is a schematic plan view of a MOS transistor according to an embodiment of Reference Example.
Figure 11:
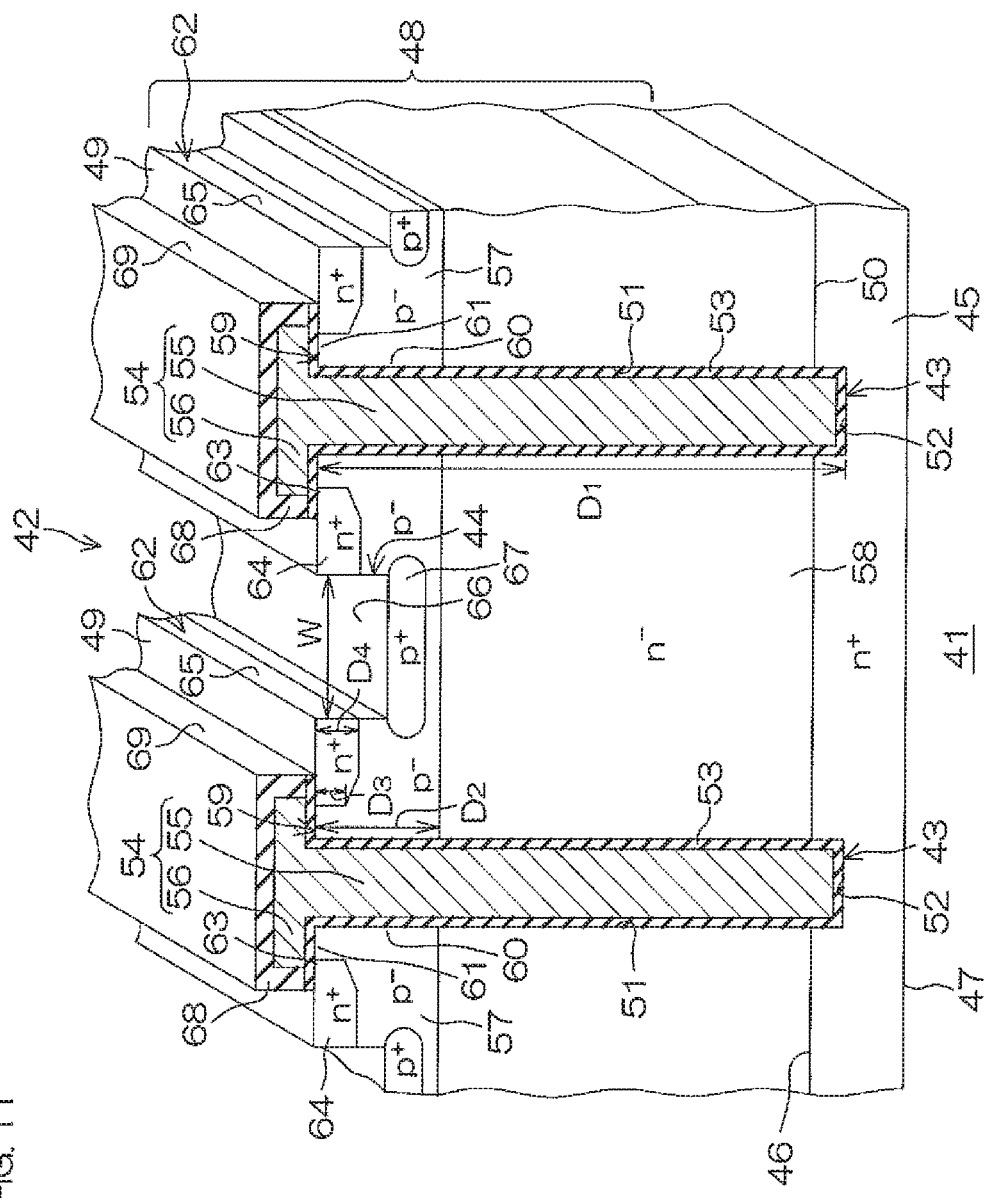
FIG. 11 is a bird's-eye sectional view of the MOS transistor taken along a cutting plane line XI-XI in FIG. 10.

FIG. 10 is a schematic plan view of a MOS transistor according to the embodiment of Reference Example. FIG. 11 is a bird's-eye sectional view of the MOS transistor taken along a cutting plane line XI-XI in FIG. 10.

Referring to FIG. 10, a MOS transistor 41 as a semiconductor device includes a plurality of striped unit cells 42 arrayed in parallel with one another. The MOS transistor 41 is partitioned into the unit cells 42 by striped gate trenches 43, and the interval between each adjacent pair of gate trenches 43 (a pitch P of the gate trenches 43) is 0.9 µm to 1.5 µm, for example. Each unit cell 42 is provided with an elongated contact trench 44 (rectangular in plan view) extending from a first longitudinal end toward a second longitudinal end thereof.

Referring to FIG. 11, the MOS transistor 41 includes a substrate 45 as a semiconductor layer made of Si of an $n^+$ type (having a concentration of $1 \times 10^{19}$ to $5 \times 10^{19}$ cm$^{-3}$, for example). The substrate 45 functions as a drain of the MOS transistor 41, and contains phosphorus (P), arsenic (As) or the like as an n-type impurity. This also applies to the following description.

An epitaxial layer 48 made of Si of an $n^+$ type (having a concentration of $1 \times 10^{16}$ to $1 \times 10^{15}$ cm$^{-3}$, for example) lower in concentration than the substrate 45 is stacked on a surface 46 (the upper surface) of the substrate 45. The thickness of the epitaxial layer 48 as the semiconductor layer is 3 µm to 50 µm, for example, and the total thickness of the semiconductor layers including the substrate 45 and the epitaxial layer 48 is 70 µm to 300 µm, for example.

The gate trenches 43, having side surfaces 51 and bottom surfaces 52, dug down from the surface 49 toward the substrate 45 are formed in the epitaxial layer 48 in a striped manner. Thus, the plurality of striped unit cells 42 partitioned by the side surfaces 51 of the striped gate trenches 43 are formed in the epitaxial layer 48.

The gate trenches 43 are deep trenches having a depth $D_1$, measured from the surface 49 of the epitaxial layer 48, of 30 µm to 50 µm (more specifically, 40 µm), for example, and pass through the epitaxial layer 48, so that deepest portions thereof are positioned in an intermediate portion in the thickness direction of the substrate 45.

A gate insulating film 53 is formed on the inner surfaces of the gate trenches 43 and peripheral edge portions of the gate trenches 43 on the surface 49 of the epitaxial layer 48, to integrally cover the same. The thickness of the gate insulating film 53 is 0.025 µm to 0.15 µm, for example.

Gate electrodes 54 are formed to be opposed to the epitaxial layer 48 through the gate insulating film 53. The gate electrodes 54 are made of polysilicon doped with an impurity in a high concentration, for example.

The gate electrodes 54 integrally include trench portions 55 charged into the gate trenches 43 and planar portions 56 drawn from end portions closer to opening ends of the trench portions 55 on both sides of the end portions in the width direction (the lateral direction) of the gate trenches 43 along the surface 49 of the epitaxial layer 48, and are formed in a T-shaped manner in sectional view.

In the vicinity (on a surface portion) of the surface 49 of the epitaxial layer 48, channel layers 57 of a p⁻ type (having a concentration of $1\times10^{17}$ to $5\times10^{17}$ cm$^{-3}$, for example) are formed around the gate trenches 43. The channel layers 57 contain boron (B), aluminum (Al) or the like, for example, as a p-type impurity. This also applies to the following description. In the epitaxial layer 48, a portion on a side of the channel layers 57 closer to a back surface 50 of the epitaxial layer 48 forms a drain layer 58.

On corner portions (trench corner portions 59) of the gate trenches 43 formed by the side surfaces 51 of the gate trenches 43 and the surface 49 of the epitaxial layer 48 intersecting with one another, the channel layers 57 are formed to hold the gate trenches 43 from both sides in the width direction thereof, and exposed on both of the surface 49 of the epitaxial layer 48 and the side surfaces 51 of the gate trenches 43. Thus, side surface portions 60 opposed to the trench portions 55 of the gate electrodes 54 and surface portions 61 opposed to the planar portions 56 of the gate electrodes 54 are formed on the channel layers 57 in the form of L shapes perpendicularly intersecting with one another on the trench corner portions 59. The depth $D_2$ of the channel layers 57 (the depth of the side surface portions 60) is smaller than that of the gate trenches 43, and 0.5 µm to 3.0 µm, for example.

On surface portions of the epitaxial layer 48 in the channel layers 57, source layers 62 are formed to be exposed on the surface 49. The source layers 62 are source wells so formed that the peripheries and lower portions thereof are entirely surrounded by the channel layers 57, which are interposed between the source layers 62 and the drain layer 58.

The source layers 62 integrally have overlap portions 63 entering portions located under end portions of the planar portions 56 of the gate electrodes 54 by prescribed quantities to overlap with part of the planar portions 56 and to be adjacent to the surface portions 61 of the channel layers 57 on a side opposite to the gate trenches 43 and contact portions 64 exposed on side surfaces 65 (described later) of the contact trench 44.

Depths of the source layers 62 vary with positions along the surface 49 of the epitaxial layer 48, and the overlap portions 63 are shallower than the contact portions 64, for example. More specifically, the depth $D_3$ of the overlap portions 63 is 0.2 µm to 1.0 µm, for example, while the depth $D_4$ of the contact portions 64 is 0.3 µm to 1.1 µm, for example. The depths of the source layers 62 are not more than three times the thickness of the gate insulating film 53, from whichever positions along the surface 49 of the epitaxial layer 48 the same are measured.

Each unit cell 42 is provided with the contact trench 44 passing through the corresponding source layer 62 from the surface 49 of the epitaxial layer 48 so that the deepest portion thereof reaches the corresponding channel layer 57. An opening width W of the contact trench 44 is constant in the depth direction thereof, and 0.2 µm to 0.5 µm, for example. The contact portions 64 of the source layer 62 are exposed on the side surfaces 65 of the contact trench 44, while the channel layer 57 is exposed on a bottom surface 66 of the contact trench 44.

A channel contact region 67 of a p⁺ type (having a concentration of $1\times10^{19}$ to $1\times10^{20}$ cm$^{-3}$, for example) is formed on the channel layer 57 exposed on the bottom surface 66 of the contact trench 44. The channel contact region 67 is linearly formed on the whole bottom surface 66 of the contact trench 44 along the longitudinal direction thereof.

An interlayer dielectric film 68 is formed on the epitaxial layer 48 to cover the gate electrodes 54 (the planar portions 56). Contact holes 69 exposing the contact trenches 44 are formed in the interlayer dielectric film 68.

A source electrode (not shown) is formed on the interlayer dielectric film 68, to be collectively in contact with all unit cells 42 (the source layers 62 and the channel contact regions 67) through the contact trenches 44. In other words, the source electrode serves as a wire common to all unit cells 42. A drain electrode is formed on a back surface 47 of the substrate 45, to cover the whole area thereof. The drain electrode serves as an electrode common to all unit cells 42.

FIGS. 12A to 12H partially illustrate manufacturing steps for the MOS transistor 41 shown in FIG. 11 in step order along cutting plane lines on the same position as FIG. 11.

Figure 12A:
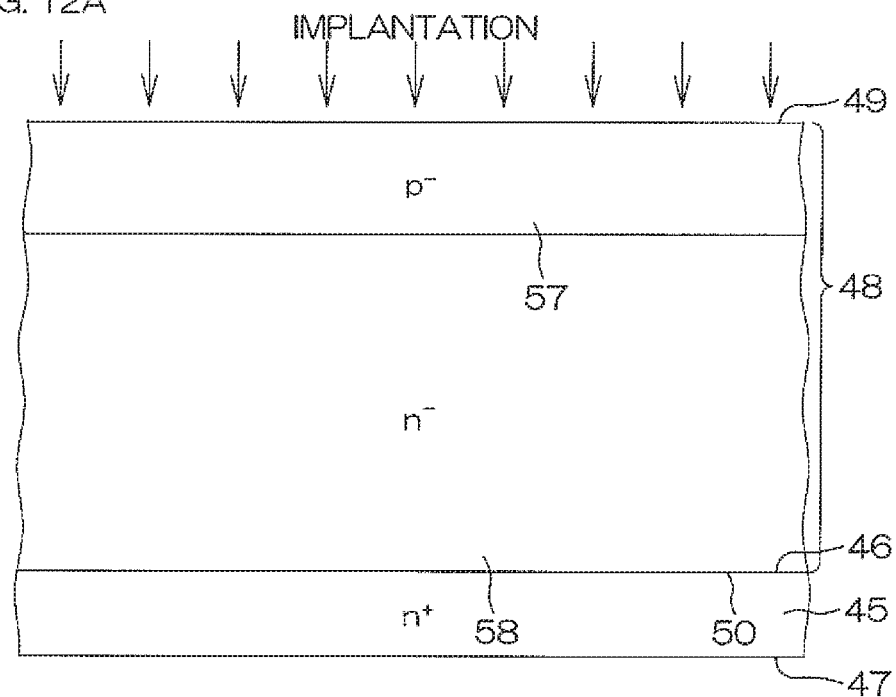
FIGS. 12A to 12H partially illustrate manufacturing steps for the MOS transistor shown in FIG. 11 in step order.

In order to manufacture the MOS transistor 41, an Si crystal is grown on the surface 46 of the substrate 45 by epitaxy such as CVD (Chemical Vapor Deposition), LPE (Liquid Phase Epitaxy) or MBE (Molecular Beam Epitaxy) while doping n-type impurity ions, as shown in FIG. 12A. Thus, the n⁻-type epitaxial layer 48 (the drain layer 58) is formed on the substrate 45. Then, p-type impurity ions (B ions) are implanted into the surface 49 of the epitaxial layer 48. After the implantation, the implanted p-type impurity ions are activated by annealing (at 900° C. to 1000° C. for 10 minutes to 30 minutes, for example), thereby forming the channel layer 57.

Figure 12B:
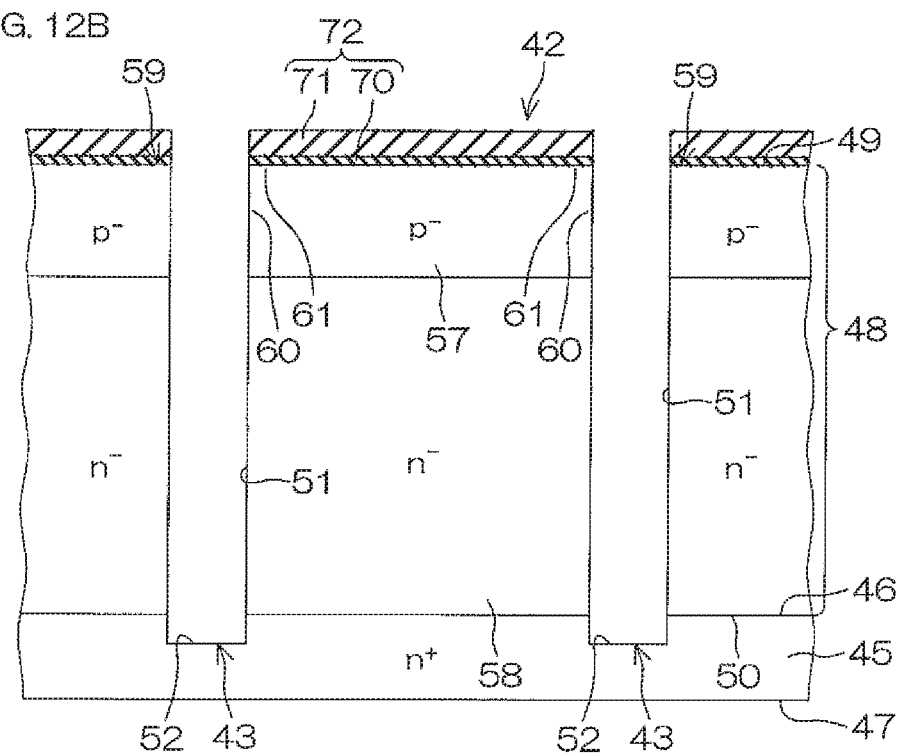

Then, an SiO₂ film 70 is formed on the surface 49 of the epitaxial layer 48 and an SiN film 71 is formed on the SiO₂ film 70 by CVD, for example, thereby forming a hard mask 72 consisting of a two-layer film including the SiO₂ film 70 and the SiN film 71, as shown in FIG. 12B. The thickness of the SiO2 film 70 is set to 50 Å to 100 Å, for example, and the thickness of the SiN film 71 is set to 1000 Å to 1500 Å, for example. Then, the epitaxial layer 48 and the substrate 45 are partially etched through the hard mask 72 to pass through the channel layer 57 and the drain layer 58. Thus, the epitaxial layer 48 is dry-etched from the surface 48, to form the gate trenches 43. At the same time, the plurality of unit cells 42 are formed in the epitaxial layer 48.

Figure 12C:
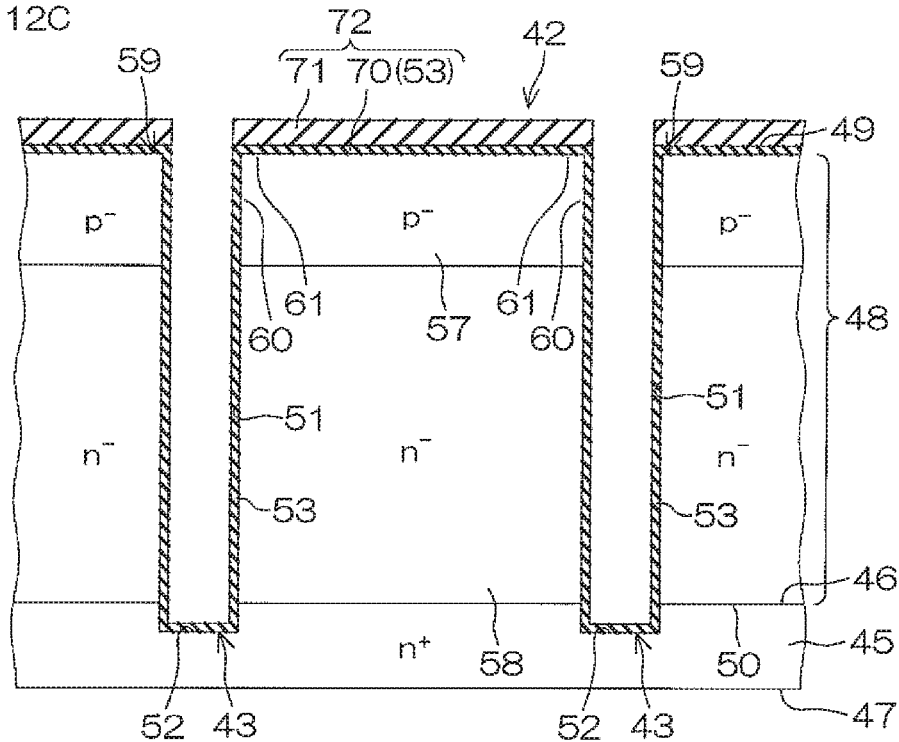

Then, the gate insulating films 53 are formed on the inner surfaces (the side surfaces 51 and the bottom surface 52) of the gate trenches 43 by thermal oxidation (at 850° C. to 950° C. for 10 minutes to 30 minutes, for example), for example, as shown in FIG. 12C. At this time, the $SiO_2$ film 70 of the hard mask 72 is integrated with the gate insulating films 53 on the trench corner portions 59, to form the gate insulating film 53 on the surface 49 of the epitaxial layer 48. Thereafter the SiN film 61 of the hard mask 72 is removed.

Figure 12D:
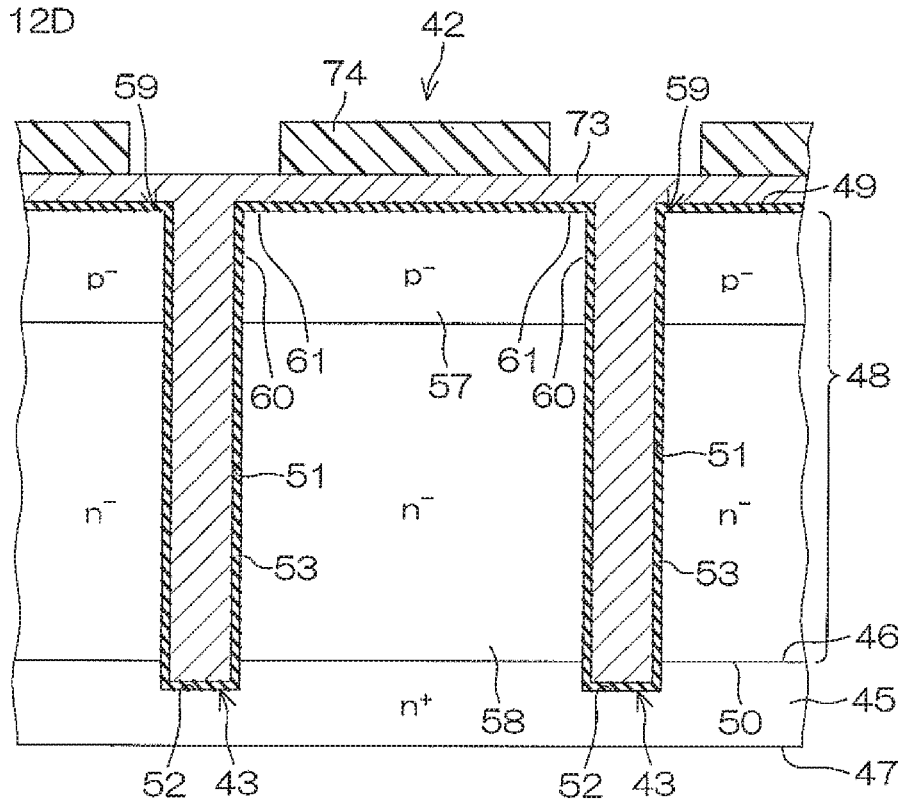

Then, doped polysilicon is deposited from above the epitaxial layer 48 by CVD, for example, as shown in FIG. 12D. The deposition of the polysilicon is continued at least until the gate trenches 43 are filled up and the surface 49 of the epitaxial layer 48 is concealed. Thus, an electrode material layer 73 is formed. Then, a photoresist film 74 of a prescribed pattern is formed on the electrode material layer 73, which in turn is selectively etched by dry etching through the photoresist film 74 employed as a mask.

Figure 12E:
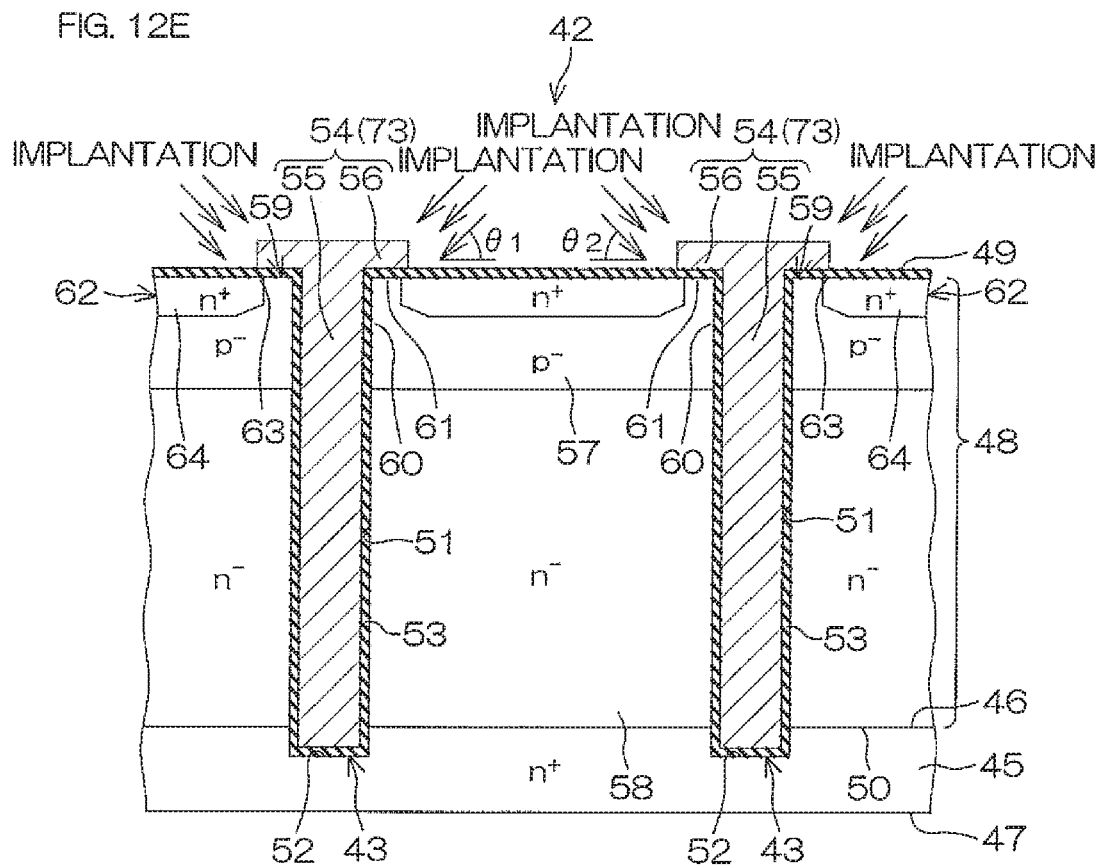

Thus, the gate electrodes 54 integrally including the trench portions 55 charged into the gate trenches 43 and the planar portions 56 drawn from end portions closer to the opening ends of the trench portions 55 on both sides of the end portions in the width direction (the lateral direction) of the gate trenches 43 along the surface 49 of the epitaxial layer 48 are formed, as shown in FIG. 12E.

Then, the gate electrodes 54 (the planar portions 56) are utilized as masks for implanting n-type impurity ions (As ions) into the surface 49 of the epitaxial layer 48 at an implantation angle $\theta_1$ inclining by 3° to 14° with respect to the surface 49 of the epitaxial layer 48, as shown in FIG. 12E (a first step).

Then, the same n-type impurity ions are implanted into the surface 49 of the epitaxial layer 48 from a side of the gate trenches 43 opposite to the implantation position in the first step at an implantation angle $\theta_2$ inclining by 3° to 14° with respect to the surface 49 of the epitaxial layer 48 to intersect with the direction of introduction of the n-type impurity ions in the first step. After the implantation, the implanted n-type impurity ions are activated by annealing (at 900° C. to 1000° C. for 10 minutes to 30 minutes, for example), thereby forming the source layers 62 in a self-aligned manner with respect to the planar portions 56.

While the overlap portions 63 entering the portions located under the planar portions 56 of the gate electrodes 54 are formed on the source layers 62 in the first and second steps, portions of the channel layers 57 provided with the overlap portions 63 are covered with the planar portions 56 in the ion implantation. Therefore, the overlap portions 63 are relatively shallowly formed ($D_3 < D_4$), dissimilarly to the portions (the contact portions 64) into which the n-type impurity ions are directly implanted.

Figure 12F:
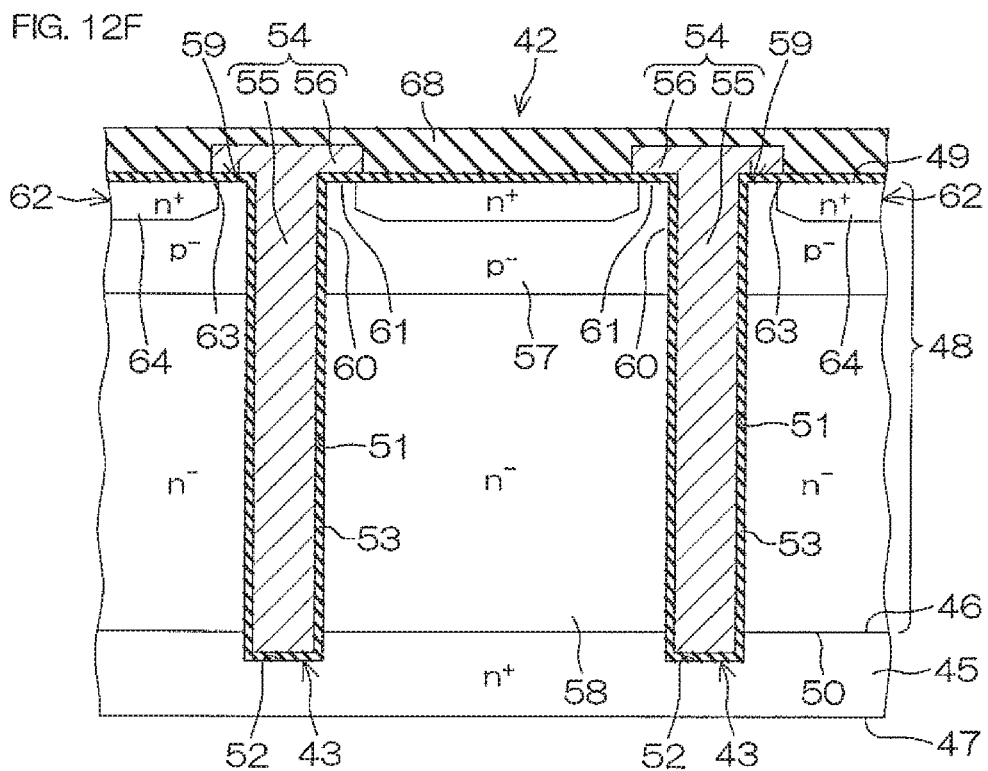

Then, the interlayer dielectric film 68 is formed by depositing $SiO_2$ (an insulating material) from above the epitaxial layer 48 by CVD, for example, as shown in FIG. 12F.

Figure 12G:
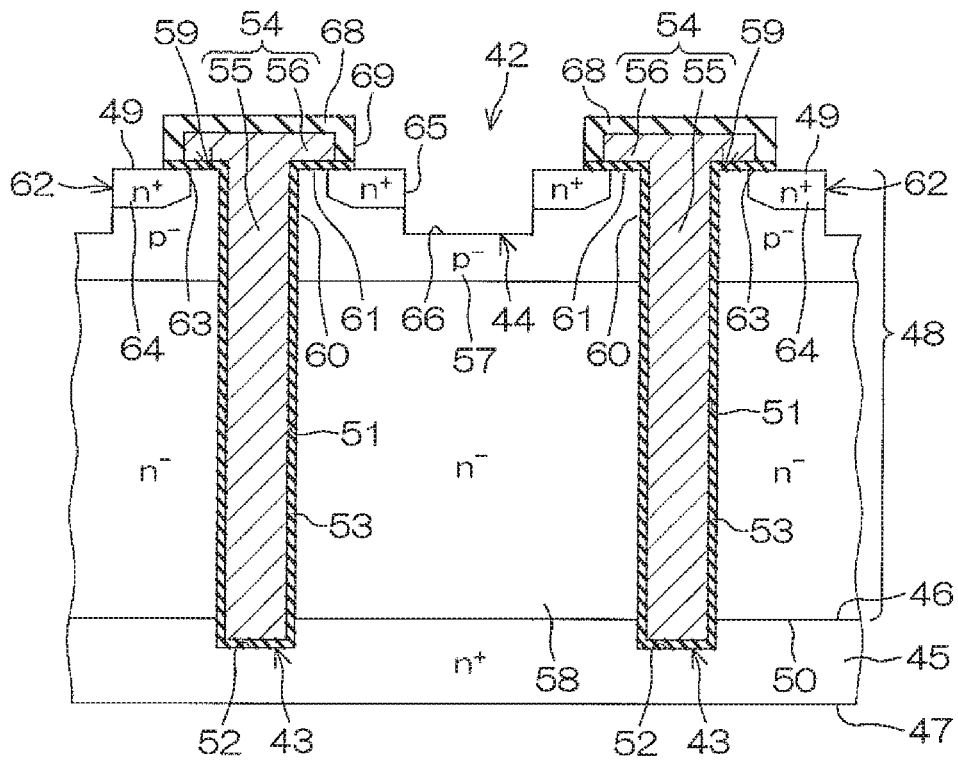

Then, each contact hole 69 is formed in the interlayer dielectric film 68 by dry etching, for example, as shown in FIG. 12G. After the formation of the contact hole 69, the interlayer dielectric film 68 is utilized as a mask to etch the exposed epitaxial layer 48. Thus, the epitaxial layer 48 is dry-etched from the surface 49, whereby each contact trench 44 is formed in a self-aligned manner with respect to the interlayer dielectric film 68.

Figure 12H:
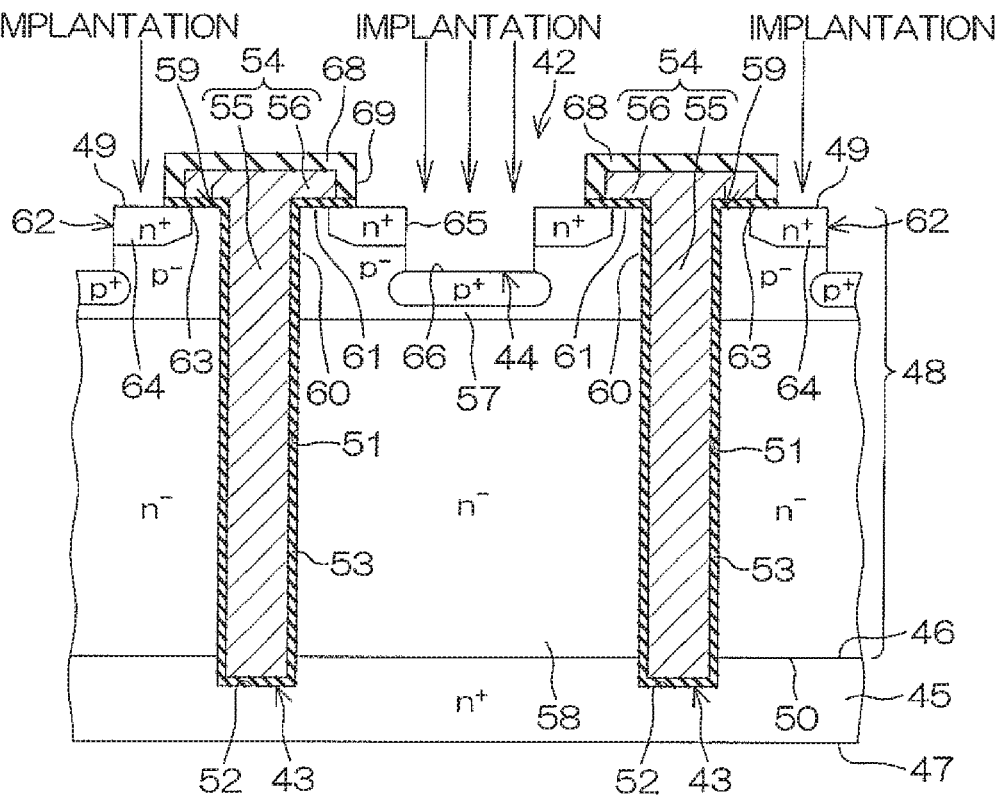

Then, an impurity is implanted by one stage into a depth position of the channel layer 57 in the vicinity of the bottom surface 66 by introducing p-type impurity ions ($BF_2$ ions) in a direction perpendicular to the bottom surface 66 of the contact trench 44 at implantation energy of about 40 keV with a dosage of about $1 \times 10^{15}$ $cm^{-3}$, as shown in FIG. 12H. After the implantation, the implanted p-type impurity ions are diffused and activated by annealing (at 900° C. to 1000° C. for 0.5 minutes to 1 minute, for example), thereby forming the channel contact region 67.

Thereafter the MOS transistor 41 shown in FIG. 11 is obtained by forming the source electrode (not shown), the drain electrode (not shown) and the like.

In the MOS transistor 41, voltage exceeding threshold voltage is applied to the gate electrode 54 in a state where drain voltage is applied between the source layer 62 and the drain layer 58 (between a source and a drain), thereby generating an electric field from the gate electrode 54 (an ON-state). Thus, a channel perpendicularly feeding current along the side surface 51 of the gate trench 43 can be formed on the side surface portion 60 of the channel layer 57 while a channel laterally feeding current along the surface 49 of the epitaxial layer 48 can be formed on the surface portion 61 of the channel layer 57 at the same time, as shown in FIG. 13(a). In other words, two-directional channels including a perpendicular channel and a lateral channel are formed in the channel layer 57, and the channels intersect with each other on the trench corner portion 59 to form an L-shaped channel as a whole.

The channel length of the L-shaped channel corresponds to the sum of the channel lengths of the perpendicular and lateral channels. The perpendicular channel length depends on the depth of the side surface portion 60 of the channel layer 57, while the lateral channel length depends on the width of the surface portion 61 of the channel layer 57.

When the channel layer 57 is formed with a designed depth in the step shown in FIG. 12A on the basis of implantation conditions for the p-type impurity ions in this embodiment, the side surface portion 60 of the channel layer 57 is covered with the planar portion 56 (a mask) of the gate electrode 54 in the subsequent step of implanting the n-type impurity ions for forming the source layer 62 shown in FIG. 12E. Therefore, the side surface portion 60 is not influenced by the n-type impurity ions. While the n-type impurity ions are obliquely implanted in this embodiment and hence the same are slightly implanted also into a portion located under the planar portion 56, the quantity of the n-type impurity ions is small and the implanted position remains in an end portion of the planar portion 56, whereby the side surface portion 60 of the channel layer 57 is not influenced by the n-type impurity ions. Therefore, the depth of the side surface portion 60 of the channel layer 57 can be precisely kept as designed in this embodiment, whereby the perpendicular channel length can be precisely controlled as designed.

While the width of the surface portion 61 of the channel layer 57 is influenced by the precision of the source layer 62 formed on the side thereof, the source layer 62 is formed in a self-aligned manner with respect to the planar portion 56 (the mask) of the gate electrode 54 formed by the etching excellent in working accuracy, as shown in FIG. 12E. Therefore, the source layer 62 can be prevented from excessively advancing toward the surface portion 61 of the channel layer 57 covered with the planar portion 56, whereby the width of the surface portion 61 of the channel layer 57 can be precisely controlled as designed by forming the planar portion 56 by etching the electrode material layer 73 as designed. Consequently, the lateral channel length can also be precisely controlled as designed, similarly to the perpendicular channel length.

According to the MOS transistor 41, part of the source layer 62 is formed as the overlap portion 63 to overlap with the planar portion 56 of the gate electrode 54, whereby the surface portion 61 of the channel layer 57 adjacent to the overlap portion 63 can be reliably opposed to the planar portion 56 of the gate electrode 54. Consequently, a highly reliable transistor operation can be performed.

Such an overlap portion 63 can be easily formed by positively implanting n-type impurity ions into the portion located under the planar portion 56 through the oblique implantation, as shown in FIG. 12E.

According to the MOS transistor 41, further, the gate trench 43 is a deep trench reaching the substrate 45 from the surface 49 of the epitaxial layer 48 through the channel layer 57 and the drain layer 58, whereby carriers (electrons) contained in the drain layer 58 can be induced to the vicinity of the side surface 51 of the gate trench 43 due to an electric field from the gate electrode 54 when the MOS transistor 41 is turned on. The induced carriers are stored to be uniformly distributed in the depth direction of the gate trench 43 along the side surface 51, to form a stratified carrier storage layer 75 in the vicinity of the side surface 51 of the gate trench 43.

When the MOS transistor 41 is in an ON-state, the carrier storage layer 75 can be utilized as a current path. Therefore, on-resistance of the MOS transistor 41 can be reduced, regardless of the value of resistance specific to the epitaxial layer 48. Therefore, high withstand voltage can be attained by increasing the thickness of the epitaxial layer 48 while keeping low on-resistance.

While the embodiment of Reference Example has been described, Reference Example may be embodied in other ways.

Figure 14:
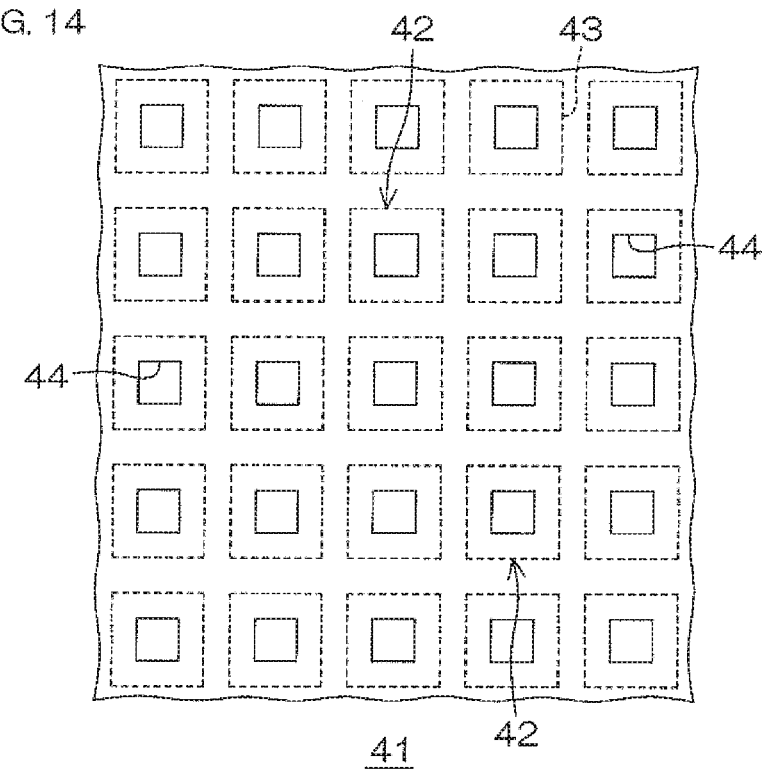
FIG. 14 illustrates a first modification of a layout of unit cells of the MOS transistor shown in FIG. 10.
Figure 15:
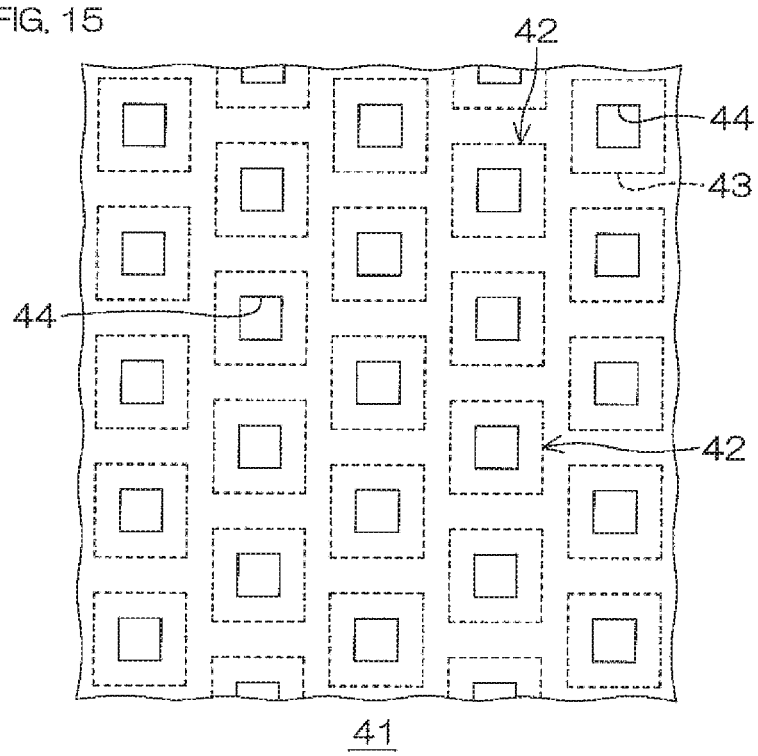
FIG. 15 illustrates a second modification of the layout of the unit cells of the MOS transistor shown in FIG. 10.

For example, the unit cells 42 may not necessarily be arranged in a striped manner, but may be arranged in the form of a matrix as shown in FIG. 14, or may be arranged in a zigzag manner as shown in FIG. 15.

Further, each unit cell 42 is not restricted to the striped shape (FIG. 10) or a square pole shape (FIG. 14 or 15), but may in the form of another polygon such as a triangular, pentagonal or hexagonal prism, for example.

In the MOS transistor 41, the conductivity types of the semiconductor portions may be reversed. For example, the p-type and n-type portions of the MOS transistor 41 may alternatively be formed as n-type and p-type portions respectively.

The ion implantation for forming the source layer 62 is not restricted to the oblique implantation implanting the ions in a direction inclining with respect to the surface 49 of the epitaxial layer 48, but perpendicular implantation implanting ions in a direction perpendicular to the surface 49 of the epitaxial layer 48 may be employed, for example.

The epitaxial layer 48 may be replaced with an SiC epitaxial layer, for example.

Characteristics to be Grasped from Disclosure of Embodiment of Reference Example For example, the following invention (1) to (14) can be grasped from the disclosure of the embodiment of Reference Example:

(1) A wide band gap semiconductor device including:

a first conductivity type semiconductor layer provided with a gate trench, a gate electrode, opposed to the semiconductor layer through a gate insulating film, integrally including a trench portion charged into the gate trench and a planar portion laterally drawn from an end portion closer to an opening end of the trench portion along a surface of the semiconductor layer, a second conductivity type channel layer, formed on a surface portion of the semiconductor layer to be exposed on both of the surface of the semiconductor layer and a side surface of the gate trench with a depth smaller than the depth of the gate trench, including a surface portion opposed to the planar portion of the gate electrode and a side surface portion opposed to the trench portion of the gate electrode, and a first conductivity type source layer formed on the channel layer to be exposed on the surface of the semiconductor layer and adjacent to the surface portion of the channel layer on a side opposite to the gate trench.

(2) The semiconductor device according to (1), wherein the source layer has an overlap portion entering a portion located under the end portion of the planar portion by a prescribed quantity and overlapping with part of the planar portion.

(3) The semiconductor device according to (2), wherein the overlap portion of the source layer is shallower than the remaining portion of the source layer.

(4) The semiconductor device according to any one of (1) to (3), wherein the depth of the source layer is not more than three times the thickness of the gate insulating film.

(5) The semiconductor device according to any one of (1) to (4), wherein the gate trench includes such a deep trench that a storage layer of first conductivity type carriers contained in the semiconductor layer is formed along a side surface thereof due to an electric field from the gate electrode when the semiconductor device is turned on.

(6) The semiconductor device according to (5), wherein the semiconductor layer includes a first conductivity type substrate and an epitaxial layer, formed on the substrate, having a lower impurity concentration than the substrate, and the deep trench includes a trench reaching the substrate through the epitaxial layer.

(7) The semiconductor device according to any one of (1) to (6), wherein the thickness of the semiconductor layer is 70 µm to 300 µm.

(8) The semiconductor device according to any one of (1) to (7), wherein the depth of the gate trench is 30 µm to 50 µm.

(9) The semiconductor device according to any one of (1) to (8), wherein the gate trench is formed to partition unit cells arrayed in a striped manner.

(10) The semiconductor device according to any one of (1) to (8), wherein the gate trench is formed to partition unit cells arrayed in the form of a matrix.

(11) The semiconductor device according to any one of (1) to (8), wherein the gate trench is formed to partition unit cells arrayed in a zigzag manner.

(12) A method of manufacturing a wide band gap semiconductor device, including the steps of:

forming a channel layer to be exposed on a surface of a first conductivity type semiconductor layer by implanting second conductivity type ions into the semiconductor layer, forming a gate trench deeper than the channel layer by etching the semiconductor layer from the surface to pass through the channel layer, forming a gate insulating film on an inner surface of the gate trench and the surface of the semiconductor layer, depositing an electrode material on the gate insulating film until the gate trench is filled up and the surface of the semiconductor layer is covered, forming a gate electrode integrally including a trench portion charged into the gate trench and a planar portion laterally drawn from an end portion closer to an opening end of the trench portion along the surface of the semiconductor layer by patterning a portion of the electrode material other than the gate trench by etching, and forming a source layer in a self-aligned manner with respect to the planar portion by implanting first conductivity type ions into the channel layer through the surface of the semiconductor layer in a state where a portion of the channel layer located under the planar portion is covered with the planar portion.

(13) The method of manufacturing a wide band gap semiconductor device according to (12), wherein the step of forming the source layer includes a step of obliquely implanting the first conductivity type ions at an implantation angle inclining with respect to the surface of the semiconductor layer so that part of the source layer enters a portion under an end portion of the planar portion by a prescribed quantity to form an overlap portion overlapping with part of the planar portion.

(14) The method of manufacturing a wide band gap semiconductor device according to (13), wherein the step of forming the gate trench includes a step of forming a striped trench so that unit cells are arrayed on the semiconductor layer in a striped manner, and the step of obliquely implanting the first conductivity type ions includes a first step of obliquely implanting the first conductivity type ions into the striped trench from one side in the width direction and a second step of obliquely implanting the first conductivity type ions into the striped trench from a side opposite to an implantation position in the first step in a direction intersecting with a direction of introduction of the first conductivity type ions in the first step.

Effects of Aforementioned Characteristics to he Grasped

The semiconductor device according to (1) can be manufactured by the method of manufacturing a wide band gap semiconductor device according to (12), for example.

According to the invention of (1) and (12), two-directional channels including a channel formed on a side surface portion of the channel layer by an electric field from the gate electrode or for perpendicularly feeding current along the side surface of the gate trench and a channel formed on a surface portion of the channel layer for laterally feeding current along the surface of the semiconductor layer can be formed.

The perpendicular channel length depends on the depth of the side surface portion of the channel layer, while the lateral channel length depends on the width of the surface portion of the channel layer.

When the channel layer is formed with a depth as designed on the basis of implantation conditions for the second conductivity type ions in the invention of Reference Example, the side surface portion of the channel layer is covered with the planar portion (a mask) of the gate electrode in subsequent step of implanting the first conductivity type ions for forming the source layer, whereby the same is not influenced by the first conductivity type ions. Therefore, the depth of the side surface portion of the channel layer can be precisely kept as designed, whereby the perpendicular channel length can be precisely controlled as designed.

While the width of the surface portion of the channel layer is influenced by the precision of the source layer formed on the side thereof, the source layer is formed in a self-aligned manner with respect to the planar portion (the mask) of the gate electrode formed by the etching excellent in working accuracy. The source layer can be prevented from excessively advancing toward the surface portion of the channel layer covered with the planar portion, whereby the width of the surface portion of the channel layer can be precisely controlled as designed by forming the planar portion by etching the electrode material as designed. Consequently, the lateral channel length can also be precisely controlled as designed, similarly to the perpendicular channel length.

Preferably in the semiconductor device according to Reference Example, the source layer has the overlap portion entering the portion located under the end portion of the planar portion by the prescribed quantity to overlap with part of the planar portion, as described in (2). In this case, the overlap portion of the source layer may be shallower than the remaining portion of the source layer, as described in (3).

According to the structure, the surface portion of the channel layer is reliably opposed to the planar portion of the gate electrode, whereby a highly reliable transistor operation can be performed.

In the semiconductor device according to Reference Example, the depth of the source layer may be not more than three times the thickness of the gate insulting film, as described in (4).

Preferably in the semiconductor device according to Reference Example, the gate trench includes such a deep trench that a storage layer of first conductivity type carriers contained in the semiconductor layer is formed along the side surface thereof due to an electric field from the gate electrode when the semiconductor device is turned on, as described in (5).

According to the structure, the carrier storage layer having low resistance is formed on the semiconductor layer, and can be utilized as a current path in an ON-state of the semiconductor device. Therefore, on-resistance of the semiconductor device can be reduced, regardless of the value of resistance specific to the semiconductor layer. Thus, high withstand voltage can be attained by increasing the thickness of the semiconductor layer while keeping low on-resistance.

More specifically, the deep trench preferably includes the trench reaching the substrate through the epitaxial layer when the semiconductor layer includes the first conductivity type substrate and the epitaxial layer, formed on the substrate, having a lower impurity concentration than the substrate, as described in (6).

Thus, the carrier storage layer can be formed on the whole section of the epitaxial layer, having a low impurity concentration and hindering reduction of the on-resistance, in the thickness direction, whereby a remarkable effect of reducing the on-resistance can be attained.

In the semiconductor device according to Reference Example, the thickness of the semiconductor layer may be 70 $\mu$m to 300 $\mu$m as described in (7), and the depth of the gate trench may be 30 $\mu$m to 50 $\mu$m as described in (8).

The gate trench may be formed to partition any of the unit cells arrayed in a striped manner as described in (8), the unit cells arrayed in the form of a matrix as described in (10), and the unit cells arrayed in a zigzag manner as described in (11).

Preferably in the method of manufacturing a wide band gap semiconductor device according to Reference Example, the step of forming the source layer includes the step of obliquely implanting the first conductivity type ions at the implantation angle inclining with respect to the surface of the semiconductor layer so that part of the source layer enters the portion under the end portion of the planar portion by the prescribed quantity to form the overlap portion overlapping with part of the planar portion, as described in (13).

According to the method, the first conductivity type ions can be positively implanted into the portion under the planar portion, whereby the overlap portion of the source layer can be easily formed.

Preferably, the step of obliquely implanting the first conductivity type ions includes the first step of obliquely implanting the first conductivity type ions into the striped trench from one side in the width direction and the second step of obliquely implanting the first conductivity type ions into the striped trench from the side opposite to the implantation position in the first step in the direction intersecting with the direction of introduction of the first conductivity type ions in the first step when the step of forming the gate trench includes the step of forming the striped trench so that the unit cells are arrayed on the semiconductor layer in a striped manner, as described in (14).

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2011-183041 filed with the Japan Patent Office on Aug. 24, 2011, Japanese Patent Application No. 2011-211443 filed with the Japan Patent Office on Sep. 27, 2011, and Japanese Patent Application No. 2012-132261 filed with the Japan Patent Office on Jun. 11, 2012, the disclosures of which are incorporated herein by reference.

What is claimed is:

1. A wide band gap semiconductor device comprising:
a semiconductor layer having a first surface and a second surface;
a first trench formed on the first surface of the semiconductor layer;
a second trench formed on the first surface of the semiconductor layer;
a first region of a first conductivity type formed at the first surface of the semiconductor layer, the first region forming a part of a side surface of the first trench;
a second region of a second conductivity type formed on a side of the first region facing the second surface of the semiconductor layer, the second region forming a part of the side surface of the first trench;
a contact region of the second conductivity type formed on a surface of the second region;
a third region of the first conductivity type formed on a side of the second region facing the second surface of the semiconductor layer, the third region forming a portion of the bottom surface of the first trench;
an insulating film formed on an inner surface of the first trench; and
a first electrode embedded inside the insulating film in the first trench, wherein
the second region integrally includes a first portion arranged closer to the first surface of the semiconductor layer and a second portion arranged below the first portion, the second portion is projecting from the first portion toward the second surface of the semiconductor layer to a depth below the bottom surface of the first trench,
the second portion of the second region defines a boundary surface with the third region, the boundary surface being at an incline with respect to the first surface of the semiconductor layer, and
a peak of the depth of the second portion is placed between the first trench and the second trench, and below the contact region.

2. The wide band gap semiconductor device according to claim 1, further comprising a surrounded portion at least partially surrounded by the semiconductor layer, a bottom of the surrounded portion being between the first surface of the semiconductor layer and the second surface of the semiconductor layer, the surrounded portion being disposed immediately above the first portion of the second region.

3. The wide band gap semiconductor device according to claim 2, wherein an insulating layer is formed over the first trench and the second trench.

4. The wide band gap semiconductor device according to claim 3, wherein a source electrode is formed over the insulating layer and the semiconductor layer.

5. The wide band gap semiconductor device according to claim 4, wherein a highly doped impurity concentration region is formed beneath the surrounded portion.

6. The wide band gap semiconductor device according to claim 5, wherein the semiconductor layer includes an SiC layer.

7. The wide band gap semiconductor device according to claim 6, wherein the surrounded portion includes a third portion of a conductive material.

8. The wide band gap semiconductor device according to claim 7, wherein the second portion of the second region has a width wider than a largest width of the surrounded portion.

9. The wide band gap semiconductor device according to claim 7, wherein an impurity concentration of the second portion of the second region is not more than 1/100 of an impurity concentration of the third portion.

10. The wide band gap semiconductor device according to claim 7, wherein the second portion of the second region includes a peak immediately under the third portion formed along a position under a central portion in the width direction of the bottom surface of the surrounded portion.

11. The wide band gap semiconductor device according to claim 7, wherein the second portion of the second region includes a peak immediately under the third portion, the peak formed along a position under an end portion in the width direction of the bottom surface of the surrounded portion.

12. The wide band gap semiconductor device according to claim 7, wherein the second portion of the second region includes a plurality of peaks formed in parallel with one another at positions under both end portions, in a width direction, of the bottom surface of the surrounded portion.

13. The wide band gap semiconductor device according to claim 7, wherein the second portion of the second region projects in the form of a parabola such that an apex of the parabola is under a central portion, in a width direction, of the bottom surface of the surrounded portion.

14. The wide band gap semiconductor device according to claim 7, wherein the second portion of the second region projects in the form of two parabolas such that apexes of the two parabolas are located under a first end portion and a second end portion, respectively, in the width direction, of the bottom surface of the surrounded portion.

15. The wide band gap semiconductor device according to claim 14, wherein respective peaks of the second portion of the second region are arranged in parallel with each other along the surrounded portion.

16. The wide band gap semiconductor device according to claim 7, wherein the second portion of the second region includes a plurality of peaks that are line-symmetrical with respect to a symmetry axis formed by a perpendicular plane passing through a central portion in a width direction of the bottom surface of the surrounded portion.

17. The wide band gap semiconductor device according to claim 7, wherein
the semiconductor layer includes an Si substrate and an Si epitaxial layer formed on the Si substrate, the Si epitaxial layer having an impurity concentration lower than an impurity concentration of the Si substrate, and
a peak of the second portion of the second region is not in contact with the Si substrate.

18. The wide band gap semiconductor device according to claim 7, wherein the thickness of the first portion of the second region is 0.5 µm to 0.9 µm and the thickness up to a peak of the second portion of the second region is 1.0 µm to 1.6 µm.

19. The wide band gap semiconductor device according to claim 7, wherein the first trench projects 0.2 µm to 0.1 µm from an interface between the first portion and the third region.

20. The wide band gap semiconductor device according to claim 7, wherein the surrounded portion has a stripe shape, and
the second portion of the second region is formed in a stripe shape along the stripe-shaped surrounded portion.

21. The wide band gap semiconductor device according to claim 7, wherein the surrounded portion is shallower than the first trench.

22. The wide band gap semiconductor device according to claim 7, the insulating film includes silicon oxide film.

23. The wide band gap semiconductor device according to claim 7, wherein the third region is partly arranged between the side surface of the first trench and the boundary surface of the second portion of the second region.

24. The wide band gap semiconductor device according to claim 7, wherein an impurity concentration of part of the first portion of the second region is $1\times10^{17}$ to $5\times10^{17}$ cm$^{-3}$.

25. A wide band gap semiconductor device comprising:
a semiconductor layer having a first surface and a second surface;
a first trench formed on the first surface of the semiconductor layer;
a second trench formed on the first surface of the semiconductor layer;
a first region of a first conductivity type formed at the first surface of the semiconductor layer, the first region forming a part of a side surface of the first trench;
a second region of a second conductivity type formed on a side of the first region facing the second surface of the semiconductor layer, the second region forming a part of the side surface of the first trench;
a contact region of the second conductivity type formed on a surface of the second region;
a third region of the first conductivity type formed on a side of the second region facing the second surface of the semiconductor layer, the third region forming a portion of the bottom surface of the first trench;
an insulating film formed on an inner surface of the first trench; and
a first electrode embedded inside the insulating film in the first trench, wherein
the second region integrally includes a first portion arranged closer to the first surface of the semiconductor layer and a second portion arranged below the first portion, the second portion is projecting from the first portion toward the second surface of the semiconductor layer to a depth below the bottom surface of the first trench, and
the second portion of the second region defines a boundary surface with the third region, the boundary surface being at an incline with respect to the first surface of the semiconductor layer,
a peak portion of the depth is placed between the first trench and the second trench, and
a center of the contact region and a center of the peak portion are substantially the same.

26. The wide band gap semiconductor device according to claim 25, further comprising a surrounded portion at least partially surrounded by the semiconductor layer, a bottom of the surrounded portion being between the first surface of the semiconductor layer and the second surface of the semiconductor layer, the surrounded portion being disposed immediately above the first portion of the second region.

27. The wide band gap semiconductor device according to claim 26, wherein an insulating layer is formed over the first trench and the second trench.

28. The wide band gap semiconductor device according to claim 27, wherein a source electrode is formed over the insulating layer and the semiconductor layer.

29. The wide band gap semiconductor device according to claim 28, wherein a highly doped impurity concentration region is formed beneath the surrounded portion.

30. The wide band gap semiconductor device according to claim 29, wherein the semiconductor layer includes an SiC layer.

31. The wide band gap semiconductor device according to claim 30, wherein the surrounded portion includes a third portion of a conductive material.

32. The wide band gap semiconductor device according to claim 31, wherein the second portion of the second region has a width wider than a largest width of the surrounded portion.

33. The wide band gap semiconductor device according to claim 31, wherein an impurity concentration of the second portion of the second region is not more than 1/100 of an impurity concentration of the third portion.

34. The wide band gap semiconductor device according to claim 31, wherein the second portion of the second region includes a peak immediately under the third portion formed along a position under a central portion in the width direction of the bottom surface of the surrounded portion.

35. The wide band gap semiconductor device according to claim 31, wherein the second portion of the second region includes a peak immediately under the third portion, the peak formed along a position under an end portion in the width direction of the bottom surface of the surrounded portion.

36. The wide band gap semiconductor device according to claim 31, wherein the second portion of the second region includes a plurality of peaks formed in parallel with one another at positions under both end portions, in a width direction, of the bottom surface of the surrounded portion.

37. The wide band gap semiconductor device according to claim 31, wherein the second portion of the second region projects in the form of a parabola such that an apex of the parabola is under a central portion, in a width direction, of the bottom surface of the surrounded portion.

38. The wide band gap semiconductor device according to claim 31, wherein the second portion of the second region projects in the form of two parabolas such that apexes of the two parabolas are located under a first end portion and a second end portion, respectively, in the width direction, of the bottom surface of the surrounded portion.

39. The wide band gap semiconductor device according to claim 38, wherein respective peaks of the second portion of the second region are arranged in parallel with each other along the surrounded portion.

40. The wide band gap semiconductor device according to claim 31, wherein the second portion of the second region includes a plurality of peaks that are line-symmetrical with respect to a symmetry axis formed by a perpendicular plane passing through a central portion in a width direction of the bottom surface of the surrounded portion.

41. The wide band gap semiconductor device according to claim 31, wherein
the semiconductor layer includes an Si substrate and an Si epitaxial layer formed on the Si substrate, the Si epitaxial layer having an impurity concentration lower than an impurity concentration of the Si substrate, and
a peak of the second portion of the second region is not in contact with the Si substrate.

42. The wide band gap semiconductor device according to claim 31, wherein the thickness of the first portion of the second region is 0.5 μm to 0.9 μm and the thickness up to a peak of the second portion of the second region is 1.0 μm to 1.6 μm.

43. The wide band gap semiconductor device according to claim 31, wherein the first trench projects 0.2 μm to 0.1 μm from an interface between the first portion and the third region.

44. The wide band gap semiconductor device according to claim 31, wherein the surrounded portion has a stripe shape, and
the second portion of the second region is formed in a stripe shape along the stripe-shaped surrounded portion.

45. The wide band gap semiconductor device according to claim 31, wherein the surrounded portion is shallower than the first trench.

46. The wide band gap semiconductor device according to claim 31, the insulating film includes silicon oxide film.

47. The wide band gap semiconductor device according to claim 31, wherein the third region is partly arranged between the side surface of the first trench and the boundary surface of the second portion of the second region.

48. The wide band gap semiconductor device according to claim 31, wherein an impurity concentration of part of the first portion of the second region is $1\times10^{17}$ to $5\times10^{17}$ cm$^{-3}$.

* * * * *

UNITED STATES PATENT AND TRADEMARK OFFICE
CERTIFICATE OF CORRECTION

PATENT NO.        : 11,038,050 B2
APPLICATION NO.   : 16/990423
DATED             : June 15, 2021
INVENTOR(S)       : Kengo Omori Page 1 of 1

It is certified that error appears in the above-identified patent and that said Letters Patent is hereby corrected as shown below:

On the Title Page

Item [60], U.S. Application No. 13/590,665, delete the filed date "August 12, 2012" and insert therefor --August 21, 2012--

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*